(12) United States Patent
Dairiki et al.

(10) Patent No.: US 7,820,495 B2
(45) Date of Patent: Oct. 26, 2010

(54) METHOD FOR MANUFACTURING SEMICONDUCTOR DEVICE

(75) Inventors: Koji Dairiki, Isehara (JP); Naoto Kusumoto, Isehara (JP); Takuya Tsurume, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 735 days.

(21) Appl. No.: 11/448,053

(22) Filed: Jun. 7, 2006

(65) Prior Publication Data

US 2007/0004102 A1    Jan. 4, 2007

(30) Foreign Application Priority Data

Jun. 30, 2005    (JP)    ............................. 2005-192420

(51) Int. Cl.
*H01L 21/00* (2006.01)
*H01L 21/30* (2006.01)

(52) U.S. Cl. ...................... 438/149; 438/455; 438/459; 257/E21.237

(58) Field of Classification Search ................. 438/149, 438/455, 459, 474
See application file for complete search history.

(56) References Cited

U.S. PATENT DOCUMENTS

| | | | |
|---|---|---|---|
| 4,660,062 | A | 4/1987 | Nishizawa et al. |
| 4,838,654 | A | 6/1989 | Hamaguchi et al. |
| 5,155,068 | A | 10/1992 | Tada |
| 5,306,651 | A | 4/1994 | Masumo et al. |
| 5,382,537 | A | 1/1995 | Noguchi |
| 5,391,257 | A | 2/1995 | Sullivan et al. |
| 5,563,092 | A | 10/1996 | Ohmi |

(Continued)

FOREIGN PATENT DOCUMENTS

CN    1574292    2/2005

(Continued)

OTHER PUBLICATIONS

Usami et al., "17.1 An SOI-Based 7.5 μm-Thick 0.15×0.15mm$^2$ RFID Chip," ISSCC 2006 (Digest of Technical Papers, IEEE International Solid-State Circuits Conference), pp. 308-309 and 655.

(Continued)

*Primary Examiner*—Hsien-ming Lee
(74) *Attorney, Agent, or Firm*—Eric J. Robinson; Robinson Intellectual Property Law Office, P.C.

(57) ABSTRACT

An object is to provide a method for manufacturing a semiconductor device which suppresses an influence on a semiconductor element due to entry of an impurity element, moisture, or the like from outside even in the case of thinning or removing a substrate after forming a semiconductor element over the substrate. A feature is to form an insulating film functioning as a protective film on at least one side of the substrate by performing surface treatment on the substrate, to form a semiconductor element such as a thin film transistor over the insulating film, and to thin the substrate. As the surface treatment, addition of an impurity element or plasma treatment is performed on the substrate. As a means for thinning the substrate, the substrate can be partially removed by performing grinding treatment, polishing treatment, or the like on the other side of the substrate.

26 Claims, 19 Drawing Sheets

U.S. PATENT DOCUMENTS

| | | | |
|---|---|---|---|
| 5,834,327 | A | 11/1998 | Yamazaki et al. |
| 6,001,727 | A | 12/1999 | Ohmi et al. |
| 6,100,166 | A | 8/2000 | Sakaguchi et al. |
| 6,127,199 | A | 10/2000 | Inoue et al. |
| 6,323,070 | B1 | 11/2001 | Yamazaki |
| 6,357,385 | B1 | 3/2002 | Ohmi et al. |
| 6,372,608 | B1 | 4/2002 | Shimoda et al. |
| 6,376,862 | B1 | 4/2002 | Yamazaki |
| 6,534,382 | B1 | 3/2003 | Sakaguchi et al. |
| 6,624,047 | B1 | 9/2003 | Sakaguchi et al. |
| 6,645,830 | B2 | 11/2003 | Shimoda et al. |
| 6,646,711 | B2 | 11/2003 | Sugano |
| 6,682,963 | B2 | 1/2004 | Ishikawa |
| RE38,466 | E | 3/2004 | Inoue et al. |
| 6,700,631 | B1 | 3/2004 | Inoue et al. |
| 6,818,530 | B2 | 11/2004 | Shimoda et al. |
| 6,818,852 | B2 | 11/2004 | Ohmi et al. |
| 6,830,994 | B2 | 12/2004 | Mitsuki et al. |
| 6,849,872 | B1 | 2/2005 | Yamazaki et al. |
| 6,885,389 | B2 | 4/2005 | Inoue et al. |
| 6,975,018 | B2 | 12/2005 | Ohmi et al. |
| 7,094,655 | B2 | 8/2006 | Fukada et al. |
| 7,105,423 | B2 | 9/2006 | Yamano et al. |
| 7,147,740 | B2 | 12/2006 | Takayama et al. |
| 7,189,624 | B2 | 3/2007 | Ito |
| 7,245,331 | B2 | 7/2007 | Yamazaki et al. |
| 7,285,476 | B2 | 10/2007 | Shimoda et al. |
| 7,332,381 | B2 | 2/2008 | Maruyama et al. |
| 7,453,090 | B2 | 11/2008 | Ito |
| 2002/0020497 | A1 | 2/2002 | Ohmi et al. |
| 2002/0030189 | A1 | 3/2002 | Ishikawa |
| 2002/0067459 | A1 | 6/2002 | Sugano |
| 2002/0113248 | A1 | 8/2002 | Yamagata et al. |
| 2002/0153831 | A1 | 10/2002 | Sakakura et al. |
| 2002/0155706 | A1 | 10/2002 | Mitsuki et al. |
| 2003/0032210 | A1 | 2/2003 | Takayama et al. |
| 2003/0062826 | A1 | 4/2003 | Seo et al. |
| 2003/0203547 | A1 | 10/2003 | Sakaguchi et al. |
| 2004/0050494 | A1 | 3/2004 | Ohmi et al. |
| 2004/0129960 | A1 | 7/2004 | Maruyama et al. |
| 2004/0164302 | A1 | 8/2004 | Arai et al. |
| 2004/0217431 | A1 | 11/2004 | Shimada |
| 2004/0238124 | A1 | 12/2004 | Nakamura |
| 2005/0011455 | A1 | 1/2005 | Yamamoto et al. |
| 2005/0023525 | A1 | 2/2005 | Ishikawa |
| 2005/0052127 | A1 | 3/2005 | Sakata et al. |
| 2005/0074963 | A1 | 4/2005 | Fujii et al. |
| 2005/0136784 | A1 | 6/2005 | Seo et al. |
| 2005/0158901 | A1 | 7/2005 | Yamazaki et al. |
| 2005/0170565 | A1 | 8/2005 | Fujii et al. |
| 2005/0282306 | A1 | 12/2005 | Yamanaka |
| 2006/0266410 | A1* | 11/2006 | Ogita et al. ............... 136/258 |
| 2006/0270236 | A1 | 11/2006 | Kusumoto et al. |
| 2006/0273319 | A1* | 12/2006 | Dairiki et al. ............... 257/66 |
| 2006/0275710 | A1* | 12/2006 | Yamazaki et al. ........... 430/313 |
| 2009/0079572 | A1* | 3/2009 | Atsumi et al. ........... 340/572.7 |

FOREIGN PATENT DOCUMENTS

| | | |
|---|---|---|
| EP | 1 453 088 | 9/2004 |
| JP | 01-181570 | 7/1989 |
| JP | 02-154232 | 6/1990 |
| JP | 03-087299 | 4/1991 |
| JP | 04-170520 | 6/1992 |
| JP | 04-178633 | 6/1992 |
| JP | 04-299859 | 10/1992 |
| JP | 05-218365 | 8/1993 |
| JP | 06-291291 | 10/1994 |
| JP | 09-105896 | 4/1997 |
| JP | 11-020360 | 1/1999 |
| JP | 11-212116 | 8/1999 |
| JP | 2000-241822 | 9/2000 |
| JP | 2000-248243 | 9/2000 |
| JP | 2001-125138 | 5/2001 |
| JP | 2001-247827 | 9/2001 |
| JP | 2002-031818 | 1/2002 |
| JP | 2002-033464 | 1/2002 |
| JP | 2002-087844 | 3/2002 |
| JP | 2002-164354 | 6/2002 |
| JP | 2002-217391 | 8/2002 |
| JP | 2004-094492 | 3/2004 |
| JP | 2004-282050 | 10/2004 |
| WO | WO 2006/006611 | 1/2006 |
| WO | WO 2006/011664 | 2/2006 |

OTHER PUBLICATIONS

Kouvatsos.D et al., "Single Crystal Silicon Thin Film Transistors Fabricated at Low Process Temperatures on Glass Substrates," Electronics Letters, Apr. 11, 1996, vol. 32, No. 8, pp. 775-777.

Reiche.M et al., "Wafer Thinning: Techniques for Ultra-Thin Wafers," Advanced Packaging (http://ap.pennnet.com/Articles/Article_Display.cfm?Section=Articles&Subsection=Display&ARTICLE_ID=169369), Mar. 1, 2003, Pennwell.

Office Action (Application No. 200610100198.6) Dated Jul. 31, 2009.

Reiche.M et al., "Wafer Thinning: Techniques for Ultra-Thin Wafers," Advanced Packaging (http://ap.pennnet.com/Articles/Article_Display.cfm?Section=Articles&Subsection=Display&ARTICLE_ID=169369), Mar. 1, 2003, Pennwell, pp. 1-4.

* cited by examiner

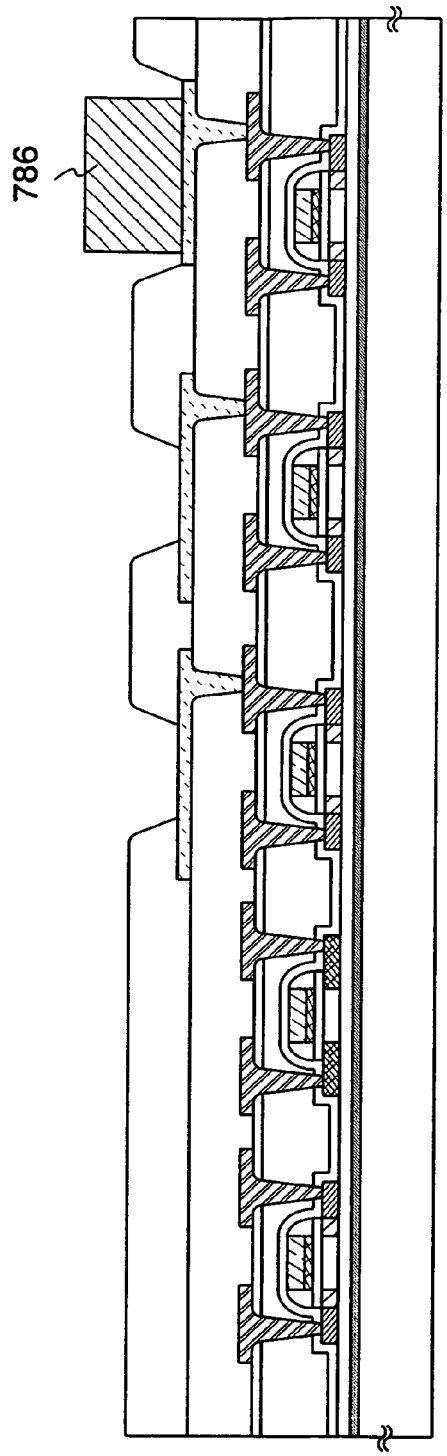
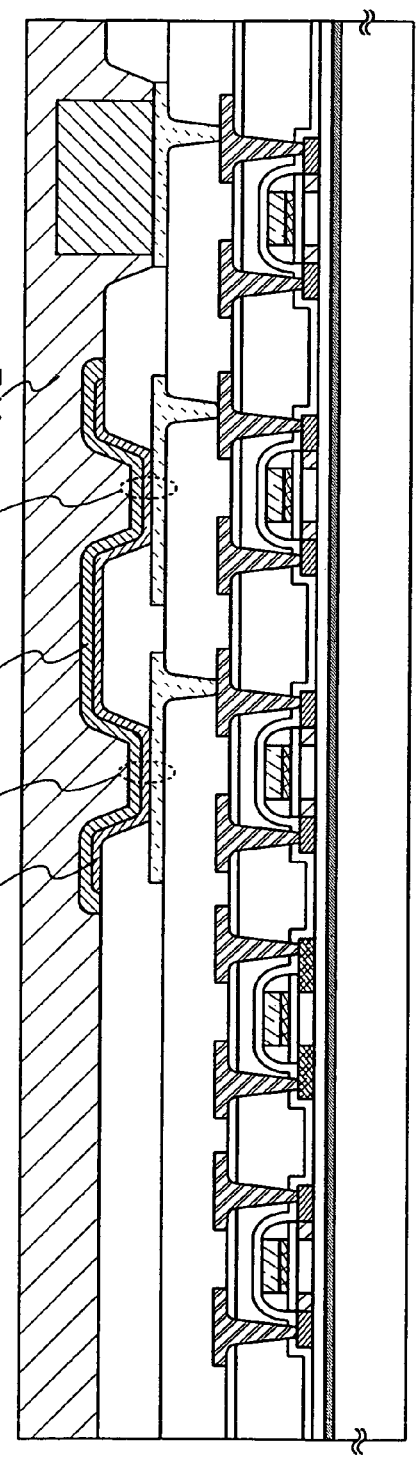
FIG. 11A
FIG. 11B

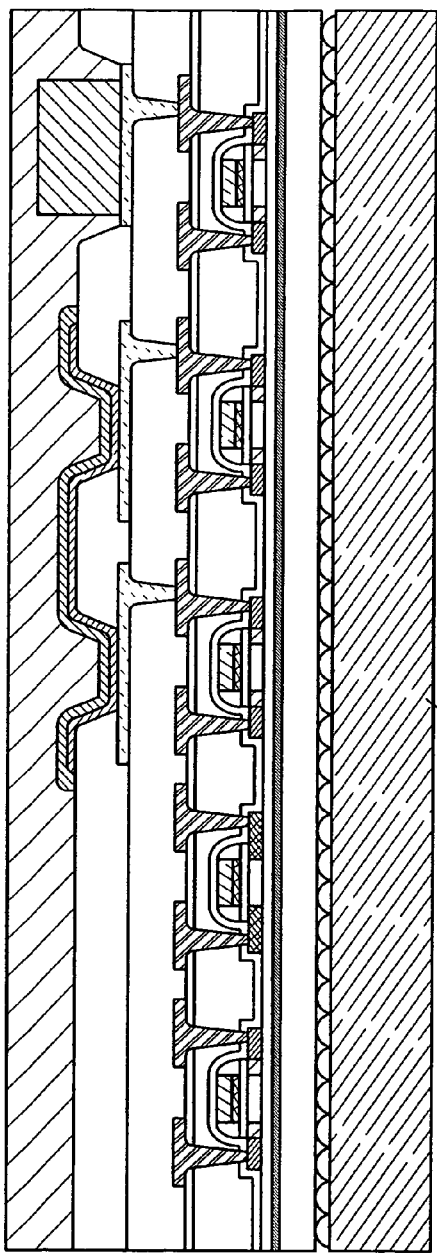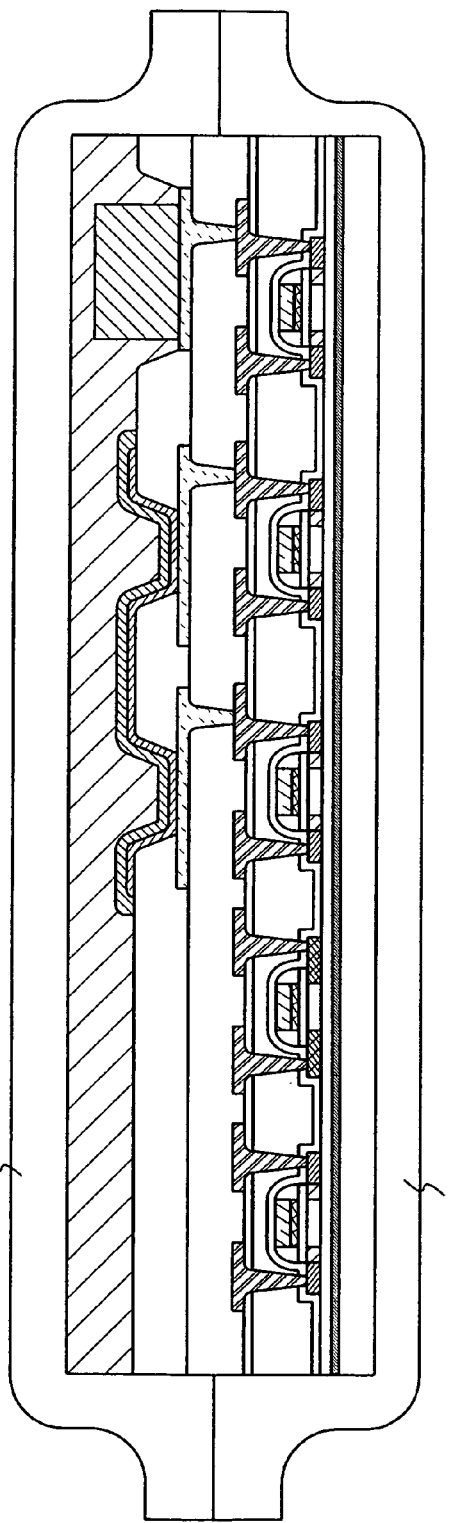
FIG. 12A
FIG. 12B

FIG. 13A  80 semiconductor device

METHOD FOR MANUFACTURING SEMICONDUCTOR DEVICE

BACKGROUND OF THE INVENTION

1. Field of the Invention

The present invention relates to a method for manufacturing a semiconductor device, and particularly to a method for manufacturing a flexible semiconductor device which can be bent.

2. Description of the Related Art

In recent years, a semiconductor element provided over a rigid substrate such as a glass substrate has been actively developed for use in a display and a photoelectric conversion element such as an LCD, an organic EL display, a photo sensor, and a solar cell. On the other hand, as for an element using a Si wafer, an IC chip has been miniaturized and thinned for use in a cellular phone and the like. In addition, a semiconductor device which transmits and receives data without contact (also referred to as an RFID (Radio Frequency Identification) tag, an ID tag, an IC tag, an IC chip, an RF (Radio Frequency) tag, a wireless tag, an electronic tag, or a wireless chip) has been actively developed. In any case of using a rigid substrate such as a glass substrate, a Si substrate, or the like for manufacturing such a semiconductor device, a reduction in thickness of a substrate is required along with needs for miniaturization and thinning.

In addition, recently, a flexible device has been required for an RFID tag embedded in paper, a display which can be wound around a pen, a profile sensor for a three-dimensional shape or a color sensor, a hand roll PC, clothes of which design is changed by changing the color, or the like. Therefore, a reduction in thickness holds an important key.

In the case of forming a semiconductor element using a pre-thinned substrate to manufacture a thin semiconductor device, warpage of the substrate due to stress, difficulty in handling, and misalignment in lithography, a printing step, and the like become problems. Consequently, a method for thinning a substrate after forming a semiconductor element over the substrate is generally used.

As for a reduction in substrate thickness by grinding or polishing, conventionally, a thinner film is formed while improving substrate planarity using an abrasive grain as a polishing step after thinning a substrate using a grindstone as a grinding step. An abrasive grain having lower Vickers hardness than that of a substrate to be polished tends to be used as a device for improving planarity. For example, cerium oxide ($CeO_2$) for a glass substrate, silicon oxide ($SiO_2$) for a silicon wafer, or the like, which has lower Vickers hardness than that of the substrate, makes it possible to selectively polish only a portion in close contact with an object by chemical reaction (for example, see Reference 1: Japanese Patent Laid-Open No. 2004-282050).

In addition, there is a technique for removing a glass substrate by wet etching using chemical reaction (for example, see Reference 2: Japanese Patent Laid-Open No. 2002-87844).

However, when a substrate is thinned or removed after providing a semiconductor element over the substrate, it is concerned that an impurity element, moisture, or the like from outside easily enters the semiconductor element and adversely affects the semiconductor element.

SUMMARY OF THE INVENTION

In view of the aforementioned problems, it is an object of the present invention to provide a method for manufacturing a semiconductor device which suppresses an influence on a semiconductor element due to entry of an impurity element, moisture, or the like from outside even in the case of thinning or removing a substrate after providing a semiconductor element over the substrate.

One feature of a method for manufacturing a semiconductor device of the present invention is to include the steps of forming an insulating film functioning as a protective film on at least one side of the substrate by performing surface treatment on the substrate, forming a semiconductor element such as a thin film transistor over the insulating film, and thinning the substrate. Note that an insulating film may be formed on the other side of the substrate. As the surface treatment, addition of an impurity element or plasma treatment is performed on the substrate. As a means for thinning the substrate, the substrate can be partially removed by performing grinding treatment, polishing treatment, or the like on the other side of the substrate. In addition, the insulating film formed on the one side of the substrate may be exposed by removing the substrate. The substrate can be removed by performing either or both grinding treatment and polishing treatment, or a combination of etching by chemical treatment with either or both grinding treatment and polishing treatment.

Another feature of a method for manufacturing a semiconductor device of the present invention is to include the steps of forming a nitrided layer by performing plasma treatment on a substrate in a nitrogen atmosphere to nitride one side of the substrate, forming a thin film transistor over the nitrided layer, and thinning the substrate by performing either or both grinding treatment and polishing treatment on the other side of the substrate. In addition, an insulating film formed on the one side of the substrate may be exposed by removing the substrate. In addition, the nitrided layer formed on the one side of the substrate may be exposed by removing the substrate. The substrate can be removed by performing either or both grinding treatment and polishing treatment, or a combination of etching by chemical treatment with either or both grinding treatment and polishing treatment. Note that the nitrided layer in the present invention contains at least nitride, and nitride is formed on the substrate by nitriding the surface of the substrate. In addition, there may be the case where the nitride formed on the substrate exists so as to have a concentration distribution depending on conditions of surface treatment.

Still another feature of a method for manufacturing a semiconductor device of the present invention is to include the steps of forming a thin film transistor over one side of a substrate, thinning the substrate by performing either or both grinding treatment and polishing treatment on the other side of the substrate, and forming a nitrided layer by performing plasma treatment on the thinned substrate in a nitrogen atmosphere to nitride a surface of the thinned substrate.

Yet another feature of a method for manufacturing a semiconductor device of the present invention is to include the steps of forming first nitride by performing plasma treatment on a substrate in a nitrogen atmosphere to nitride one side of the substrate, forming a thin film transistor over the first nitride, thinning the substrate, and forming second nitride by performing plasma treatment on the thinned substrate in a nitrogen atmosphere to nitride a surface of the thinned substrate. The substrate is thinned by performing either or both grinding treatment and polishing treatment on the other side of the substrate. In addition, etching using chemical treatment may be performed in combination with grinding treatment or polishing treatment.

According to the above feature of the invention, sealing can be performed with a flexible film to cover a semiconductor element such as the thin film transistor after thinning or removing the substrate.

In addition, a feature of the method for manufacturing a semiconductor device of the present invention according to the above feature, the plasma treatment is performed using a high frequency wave under the conditions that an electron density is in the range of $1\times10^{11}$ cm$^{-3}$ to $1\times10^{13}$ cm$^{-3}$ and an electron temperature is in the range of 0.5 eV to 1.5 eV.

One feature of a semiconductor device of the present invention is to include a nitrided layer formed on a surface of a substrate, and a thin film transistor provided over the nitrided layer, in which a thickness of the substrate is in the range of 1 µm to 100 µm, and at least part of the nitrided layer contains a noble gas element.

Another feature of a semiconductor device of the present invention is to include a nitrided layer formed on a surface of a substrate, and a thin film transistor provided over the nitrided layer, in which a thickness of the substrate is 1 µm or less, and at least part of the nitrided layer contains a noble gas element.

Still another feature of a semiconductor device of the present invention is to include a thin film transistor provided over one side of a substrate, a nitrided layer formed on the other side of the substrate, in which a thickness of the substrate is in the range of 1 µm to 100 µm, and at least part of the nitrided layer contains a noble gas element.

Yet another feature of a semiconductor device of the present invention is to include a first nitrided layer formed on one side of a substrate, a second nitrided layer formed on the other side of the substrate, and a thin film transistor provided over the first nitrided layer, in which a thickness of the substrate is in the range of 1 µm to 100 µm, and at least part of the first nitrided layer and the second nitrided layer contains a noble gas element.

Even in the case of manufacturing a flexible semiconductor device by thinning or removing a substrate after providing a semiconductor element such as a transistor over the substrate, an impurity element, moisture, or the like entering the semiconductor element from outside can be suppressed and prevented from adversely affecting characteristics of the semiconductor device, by providing a protective film over the substrate by performing surface treatment before thinning or removing the substrate or after thinning the substrate. Further, even in the case of performing surface treatment on the substrate provided with the semiconductor element, damage to the semiconductor element can be reduced by performing high-density plasma treatment as the surface treatment.

BRIEF DESCRIPTION OF DRAWINGS

FIGS. 11A and 11B are diagrams showing an example of a method for manufacturing the semiconductor device of the present invention.

FIGS. 12A and 12B are diagrams showing an example of a method for manufacturing the semiconductor device of the present invention.

FIG. 13A is a diagram of a semiconductor device of the present invention.

DETAILED DESCRIPTION OF THE INVENTION

Figure 1A:
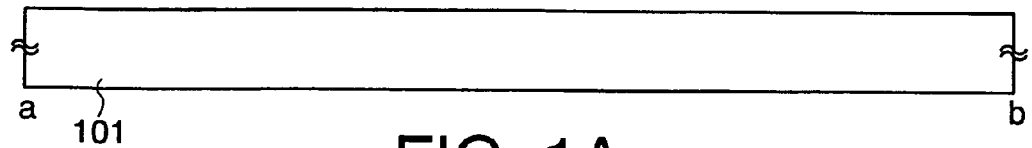
FIGS. 1A to 1E are diagrams showing an example of a method for manufacturing a semiconductor device of the present invention.

Embodiment modes of the present invention are hereinafter explained with reference to the drawings. However, the present invention is not limited to the following description. As is easily known to a person skilled in the art, the mode and the detail of the invention can be variously changed without departing from the spirit and the scope of the present invention. Thus, the present invention is not interpreted as being limited to the following description of the embodiment modes. Note that the same reference numeral is commonly used to denote the same component among different drawings in the structure of the present invention explained below.

The present invention manufactures a flexible semiconductor device, after forming a semiconductor element such as a thin film transistor (TFT) over a rigid substrate, by thinning or removing the substrate by performing any or all of grinding treatment, polishing treatment, etching by chemical treatment, and the like on the substrate. Further, the present invention includes a mode in which a protective film is formed by performing surface treatment such as plasma treatment on the substrate before thinning or removing the substrate or after thinning the substrate. Even in the case of thinning or removing the substrate, entry of an impurity element, moisture, or the like into the semiconductor element provided over the substrate can be suppressed by forming the protective film.

Hereinafter, examples of methods for manufacturing semiconductor devices of the present invention are explained with reference to FIGS. 1A to 2E. Note that FIGS. 1A to 1E show the case of performing surface treatment on a substrate in advance before thinning or removing the substrate, and FIGS.

2A to 2E show the case of performing surface treatment on a thinned substrate after thinning the substrate.

Initially, the case of performing surface treatment on a substrate before thinning or removing the substrate is explained with reference to FIGS. 1A to 1E.

First, a substrate 101 is prepared, and its surface is washed using hydrofluoric acid (HF), or alkaline or pure water (FIG. 1A).

As the substrate 101, a glass substrate of barium borosilicate glass, aluminoborosilicate glass, or the like, a quartz substrate, a ceramic substrate, a metal substrate including stainless steel, or the like may be used. Alternatively, a semiconductor substrate of Si or the like may be used.

Figure 1B:
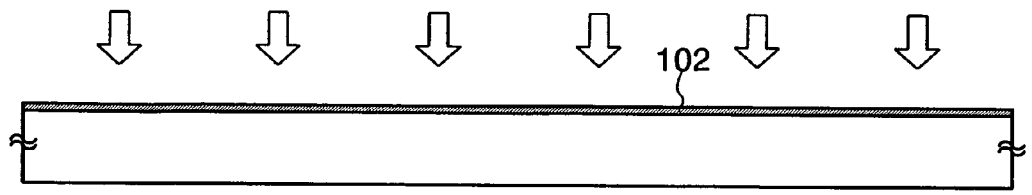

Next, surface treatment is performed on one side of the substrate 101 (FIG. 1B). The surface treatment on the substrate 101 is performed by plasma treatment or doping with an impurity element. For example, a nitrided layer 102 (hereinafter also referred to as an insulating film 102) is formed by performing plasma treatment on a surface of the substrate 100 in a nitrogen atmosphere to nitride the surface of the substrate 101. In this case, the insulating film 102 contains at least nitride, and there may be the case where the nitride formed on the substrate has a concentration distribution (here, a concentration distribution of nitrogen) depending on conditions of the surface treatment. Alternatively, an oxidized layer may be formed by oxidizing the surface of the substrate 100 by performing plasma treatment in an oxygen atmosphere, or an oxynitrided layer may be formed by performing plasma treatment in an atmosphere containing oxygen and nitrogen to oxynitride the surface of the substrate 101. Furthermore, the nitrided layer 102 can be formed by adding nitrogen (N) atoms to the surface of the substrate 101 by doping, or the nitrided layer 102 can be formed by performing heat treatment in a nitrogen atmosphere. Note that the nitrided layer 102 may be formed not only on the surface of the substrate 101 but on the other side depending on an apparatus used for the plasma treatment or the like or conditions thereof.

Note that the plasma treatment in the present invention includes oxidizing treatment, nitriding treatment, oxynitriding treatment, hydrogenating treatment, surface modification treatment, and the like on an object to be treated such as a semiconductor film, an insulating film, or a conductive film, and a gas used for the treatment may be selected depending on the purpose. For example, in the case of performing nitriding treatment on an object to be treated (here, the substrate 101), plasma treatment is performed in an atmosphere containing nitrogen (for example, in an atmosphere containing nitrogen ($N_2$) and a noble gas (including at least one of He, Ne, Ar, Kr, and Xe), an atmosphere containing nitrogen, hydrogen, and a noble gas, an atmosphere containing $NH_3$ and a noble gas, an atmosphere containing $NO_2$ and a noble gas, or an atmosphere containing $N_2O$ and a noble gas). In the case of performing oxidizing treatment on the object to be treated, plasma treatment is performed in an atmosphere containing oxygen (for example, in an atmosphere containing oxygen ($O_2$) or dinitrogen monoxide, and a noble gas (including at least one of He, Ne, Ar, Kr, and Xe), an atmosphere containing oxygen or dinitrogen monoxide, hydrogen ($H_2$), and a noble gas). Note that the treated object (here, the insulating film 102 formed on the surface of the substrate 101) may contain a noble gas used for plasma treatment. For example, in the case of using Ar, the treated object may contain Ar.

As the plasma treatment, plasma treatment using a high frequency wave (such as a microwave) under the conditions of high density (preferably, in the range of $1\times10^{11}$ cm$^{-3}$ to $1\times10^{13}$ cm$^{-3}$) and low electron temperature (preferably, in the range of 0.5 eV to 1.5 eV) is preferably performed (the plasma treatment is hereinafter referred to as high-density plasma treatment). By performing plasma excitation by introducing a high frequency wave such as a microwave, high-density plasma can be generated at low electron temperature, and the surface of the object to be treated can be oxidized or nitrided with an oxygen radical (which may contain an OH radical) or a nitrogen radical (which may contain an NH radical) that is generated by the high-density plasma. Thus, by performing high-density plasma treatment on an object to be treated, damage by plasma to the object to be treated can be suppressed since plasma density is high and electron temperature in the vicinity of the object to be treated is low. In addition, because of high plasma density, the nitrided layer or oxidized layer formed by performing nitriding treatment or oxidizing treatment on the object to be treated with the use of plasma treatment is superior in uniformity of thickness or the like to a film formed by a CVD method, a sputtering method, or the like, and a dense film can be formed. In addition, because of low plasma electron temperature, the nitriding treatment or the oxidizing treatment can be performed at lower temperature as compared to conventional plasma treatment or thermal oxidation method. Therefore, for example, in the case of using a glass substrate as the substrate, the nitriding treatment or oxidizing treatment can be performed sufficiently even in the case of performing the plasma treatment at a temperature lower by 100° C. or more than a strain point of the glass substrate.

Figure 1C:
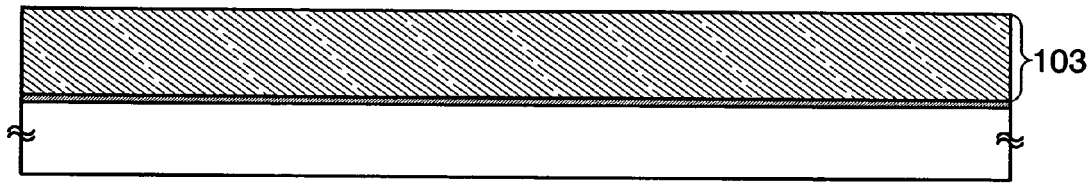

Next, an element group 103 including a semiconductor element such as a transistor or a diode is formed over the insulating film 102 formed on the surface of the substrate 101 (FIG. 1C).

The element group 103 is formed with a semiconductor element including, for example, a transistor, a diode, a solar cell, or the like. As the transistor, a thin film transistor (TFT) using a semiconductor film formed over a rigid substrate such as a glass substrate as a channel, a field effect transistor (FET) formed using a semiconductor substrate of Si or the like, which uses the substrate as a channel, an organic TFT using an organic material as a channel, or the like can be provided. As the diode, various diodes such as a variable capacitance diode, a Schottky diode, and a tunnel diode can be applied. In the present invention, all types of integrated circuits such as a CPU, a memory, and a microprocessor can be provided using the transistor, diode, or the like. In addition, the element group 103 can take the form of including an antenna in addition to the semiconductor element such as a transistor. A semiconductor device of which element group 103 is provided with an antenna operates using an AC voltage generated in the antenna, and can transmit and receive data to/from an external device (reader/writer) without contact by modulating an AC voltage applied to the antenna. Note that the antenna may be formed together with an integrated circuit including a transistor or may be electrically connected after being formed separately from the integrated circuit.

Figure 1D:
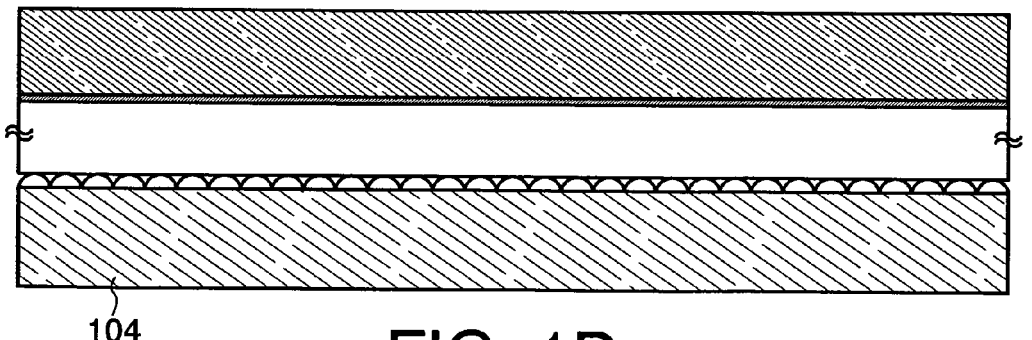

Next, the other side of the substrate 101 (a side opposite to the side provided with the insulating film 102) is subjected to grinding treatment, polishing treatment, or etching by chemical treatment, thereby thinning or removing the substrate 101 (FIG. 1D). In the grinding treatment, a surface of an object to be treated (here, the substrate 101) is grinded and smoothed using grains of an abrasive stone. In the polishing treatment, the surface of the object to be treated is smoothed by a plastic smoothing action or frictional polishing action using an abrasive agent such as a coated abrasive or abrasive grains. In the chemical treatment, chemical etching is performed using an agent on the object to be treated.

Here, an example of performing grinding treatment on the surface of the substrate 101 using a grinding means 104 is described. Note that polishing treatment is preferably further performed on the surface of the substrate 101 after the grinding treatment, and a surface shape of the substrate 101 can be uniformed by performing the polishing treatment after the grinding treatment. In addition, the substrate may be thinned or removed by further performing etching using chemical treatment after performing either or both grinding treatment and polishing treatment. In particular, in the case of removing the substrate 101, the substrate 101 can be efficiently removed by performing etching by chemical treatment after thinning the substrate to some extent by performing any or all of grinding treatment, polishing treatment, and the like. Note that in the case of using a glass substrate as the substrate 101, chemical etching using a drug solution containing a hydrofluoric acid is preferably performed as the chemical treatment. Note that in the case of thinning the substrate 101, the substrate 101 is preferably thinned to a thickness of 1 μm to 100 μm, preferably, 2 μm to 50 μm, more preferably, 4 μm to 30 μm, so that the substrate has flexibility. In addition, in the case of removing the substrate 101, the substrate is preferably removed completely, but the substrate may have a thickness of 1 μm or less.

In addition, in the case of removing the substrate 101, the insulating film 102 which is provided over the substrate 101 as a protective film can be used as a stopper by utilizing an etching selection ratio of the substrate 101 to the insulating film 102. For example, in the case of using a glass substrate as the substrate 101 and forming a nitrided layer by performing high-density plasma treatment on the glass substrate in a nitrogen atmosphere, physical strength of the nitrided layer is improved since the nitrided layer contains more nitrogen than the glass substrate on which nitriding treatment is not performed. Therefore, the nitrided layer can be utilized as a grinding or polishing stopper in grinding or polishing to remove the substrate 101. In addition, the nitrided layer can also be utilized as a stopper utilizing an etching selection ratio by chemical treatment similarly in the case of removing the substrate 101.

Figure 1E:
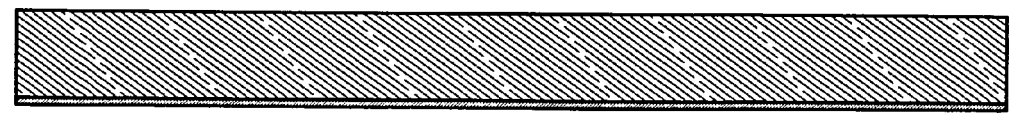

Through the above steps, a flexible semiconductor device can be manufactured (FIG. 1E). Thereafter, a semiconductor device may be completed by further sealing the element group 103 with a flexible film or the like in accordance with applications, which can be appropriately determined by a practitioner.

Thus, in the semiconductor device shown in FIGS. 1A to 1E, the element group 103 can be prevented from being mixed with an impurity element since the insulating film 102 functioning as a protective film is formed even after thinning the substrate 101.

Subsequently, the case of performing surface treatment, after thinning a substrate, on the thinned substrate is explained with reference to FIGS. 2A to 2E.

Figure 2A:
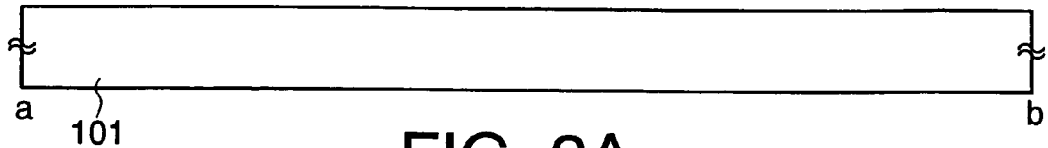
FIGS. 2A to 2E are diagrams showing an example of a method for manufacturing a semiconductor device of the present invention.

First, a substrate 101 is prepared, and its surface is washed using hydrofluoric acid (HF), or alkaline or pure water (FIG. 2A). As the substrate 101, any of the above-mentioned substrates may be used.

Figure 2B:
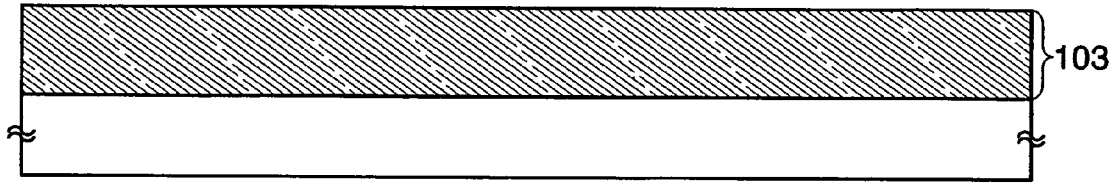

Next, an element group 103 including a semiconductor element such as a transistor is formed over the substrate 101 (FIG. 2B).

Figure 2C:
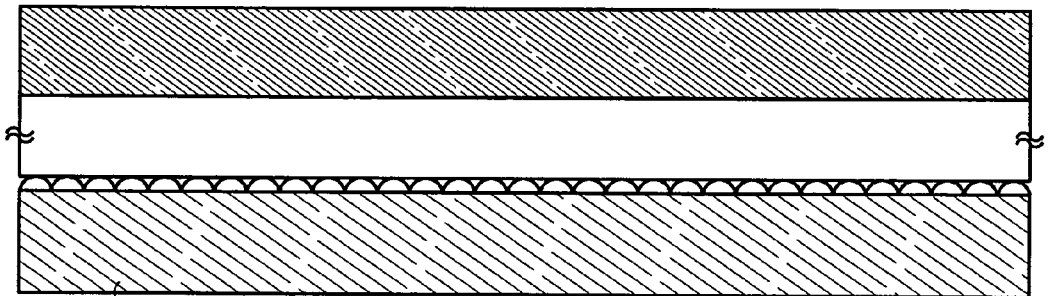
Figure 2D:
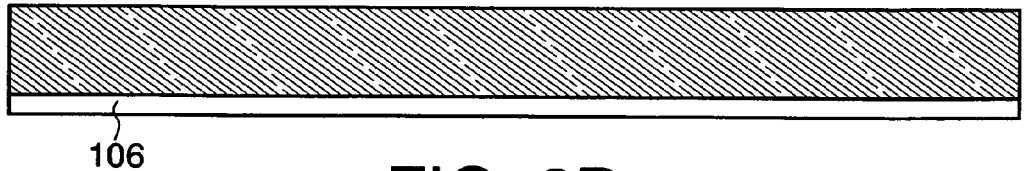

Then, the substrate 101 is thinned by grinding, polishing, or etching a surface of the substrate 101 (a side opposite to a side to be provided with the element group 103) to form a substrate 106 (FIG. 2C). Here, an example of grinding the surface of the substrate 101 using a grinding means 104 is described. A surface shape of the substrate 101 can be uniformed by further polishing the surface of the substrate 101 after grinding. In addition, the substrate may be thinned by further performing etching using chemical treatment after performing either or both grinding treatment and polishing treatment.

Figure 2E:
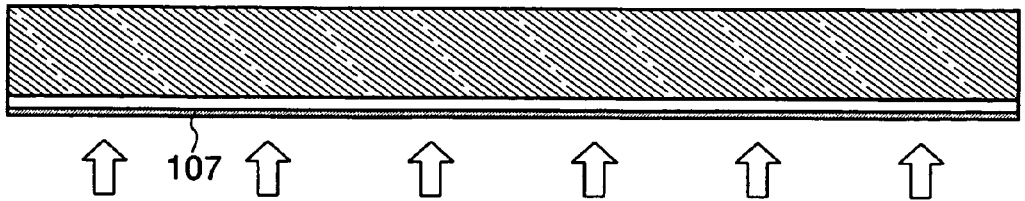

Next, surface treatment is performed on the thinned substrate 106 (FIG. 2E). The surface treatment can be performed using any of the above-mentioned methods, but the surface treatment here is preferably performed using high-density plasma treatment. An insulating film functioning as a protective film can be provided using a CVD method, a sputtering method, or the like. However, in the case of using the above method, the element group 103 that is an object to be treated may be damaged due to the influence of treatment temperature or the like, and characteristics of a transistor or the like included in the element group 103 may be adversely affected. On the other hand, in the case of performing high-density plasma treatment, plasma density is high and electron temperature in the vicinity of the object to be treated is low. Therefore, damage by plasma to the object to be treated can be suppressed. In addition, because of low plasma electron temperature, the nitriding treatment, the oxidizing treatment, or the like can be performed at lower temperature as compared to conventional plasma treatment or thermal oxidizing method. In addition, because of high plasma density, the nitrided layer, the oxidized layer, or the like formed by performing nitriding treatment or oxidizing treatment on the object to be treated with the use of plasma treatment is superior in uniformity of thickness or the like to the film formed by a CVD method, a sputtering method, or the like, and a dense film can be formed. Thus, for example, a nitrided layer 107 (hereinafter also referred to as an "insulating layer 107") which functions as a protective film is formed on the surface of the substrate 106 by performing high-density plasma treatment on the surface of the substrate 106 in a nitrogen atmosphere. In this case, the treated object (here, the insulating film 107 formed on the surface of the substrate 106) may contain a noble gas which is used for the plasma treatment, and for example, in the case of using Ar, the treated object may contain Ar. Note that the substrate 106 in a state where the insulating film 107 functioning as a protective film is formed is preferably thinned to a thickness of 1 μm to 100 μm, preferably, 2 μm to 50 μm, more preferably, 4 μm to 30 μm, so that the substrate has flexibility.

Thus, the element group 103 can be prevented from being mixed with an impurity element by forming the insulating film 107 functioning as a protective film on the surface of the thinned substrate 106 after thinning the substrate 101.

In addition, the substrate 101 can be thinned after forming the insulating film 102 functioning as a protective film as shown in FIGS. 1A to 1E, and the insulating film 107 functioning as a protective film can further be formed over the thinned substrate 106 as shown in FIGS. 2A to 2E. For example, N atoms can be added to one surface of the substrate 101 by doping before thinning the substrate 101 to form the nitrided layer 102 (the insulating film 102) on the surface of the substrate 101; the other side of the substrate 101 can be thinned after forming an element group of a transistor or the like over the substrate 101 with the insulating film 102 interposed therebetween; and the nitrided layer 107 (insulating film 107) can be formed by performing high-density plasma treatment on the thinned side of the substrate 101 in a nitrogen atmosphere. Alternatively, the nitrided layer 102 (insulating film 102) can be formed by performing high-density plasma treatment on one side of the substrate 101 in a nitrogen atmosphere before thinning the substrate 101; the other side of the substrate 101 can further be thinned after forming an element group of a transistor or the like over the substrate 101 with the insulating film 102 interposed therebetween; and an insulating film functioning as a protective film can be formed by performing high-density plasma treatment on the thinned side of the substrate 101.

Note that high-density plasma treatment is preferably employed as the surface treatment in the case of performing surface treatment on a substrate provided with an element group including a semiconductor element such as a transistor (here, in the case of performing surface treatment after thinning the substrate). This is because damage to the element group 103 during the surface treatment can be suppressed by employing high-density plasma treatment. On the other hand, in the case of performing surface treatment on a substrate that is not provided with an element group including a semiconductor element such as a transistor (here, in the case of performing surface treatment before thinning the substrate), damage to the element group or the like does not need to be considered. Therefore, a method such as high-density plasma treatment, doping with an impurity element, thermal oxidizing treatment in a nitrogen atmosphere, an oxygen atmosphere, or the like, a CVD method, or a sputtering method can be used for the surface treatment.

As described above, the insulating film 102 and the insulating film 107 which function as protective films can be formed by performing surface treatment before thinning the substrate 101 and after thinning the substrate 101. Therefore, the element group 103 can be more effectively prevented from being mixed with an impurity element from outside.

As described above, even in the case of thinning a substrate, the entry of an impurity element, moisture, or the like into a semiconductor element provided over the substrate can be suppressed by forming a protective film by performing surface treatment such as plasma treatment on the substrate before and after thinning the substrate.

Hereinafter, explanation is made on specific examples of the above-described manufacturing methods in FIGS. 1A to 1E and FIGS. 2A to 2E.

Embodiment Mode 1

In this embodiment mode, an example of a method for manufacturing a semiconductor device of the present invention is explained with reference to FIGS. 3A to 4C. Initially, the above-described manufacturing method in FIGS. 1A to 1E is explained in more detail.

Figure 3A:
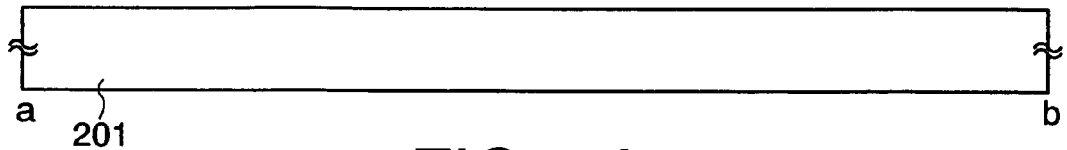
FIGS. 3A to 3E are diagrams showing an example of a method for manufacturing a semiconductor device of the present invention.

First, a substrate 201 is prepared, and a surface of the substrate 201 is washed using hydrofluoric acid (HF), or alkaline or pure water (FIG. 3A).

As the substrate 201, a glass substrate of barium borosilicate glass, aluminoborosilicate glass, or the like, a quartz substrate, a ceramic substrate, a metal substrate including stainless steel, a semiconductor substrate of Si or the like, or the like can be used. Note that the case of using a glass substrate as the substrate 201 is described here.

Figure 3B:
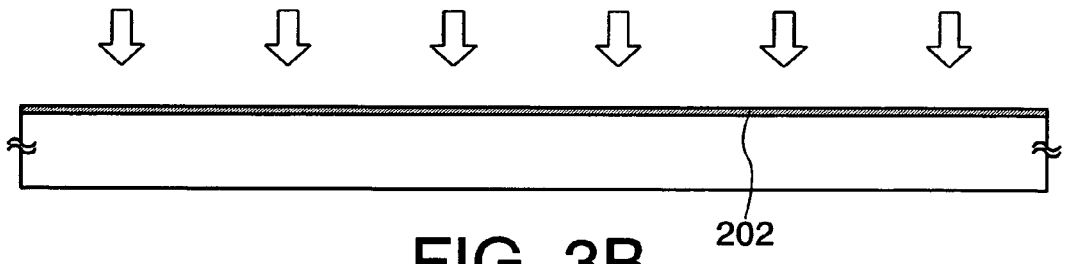

Next, nitriding treatment is performed on one side of the substrate 201 by plasma treatment to form a nitrided layer 202 (hereinafter also referred to as an "insulating film 202") on the surface of the substrate 201 (FIG. 3B). The insulating film 202 contains at least nitride, and the nitride formed on the substrate may exist so as to have a concentration distribution (here, a concentration distribution of nitrogen) depending on conditions of surface treatment. Instead of plasma treatment, the insulating film 202 can be formed on the substrate 201 by doping with N atoms. Further, in the case of performing plasma treatment, the above-mentioned high-density plasma treatment is preferably performed. The high-density plasma treatment can be performed at low electron temperature and with high density; therefore, damage to the surface of the substrate 201 can be reduced, and the surface can be densified.

By performing the high-density plasma treatment on an object to be treated, damage by plasma to the object to be treated can be suppressed since plasma density is high and electron temperature in the vicinity of the object to be treated is low. In addition, because of high plasma density, a nitrided layer, a oxidized layer, or the like formed by performing nitriding treatment or oxidizing treatment on the object to be treated with the use of plasma treatment is superior in uniformity of thickness or the like to a film formed by a CVD method, a sputtering method, or the like, and a dense film can be formed. In addition, because of low plasma electron temperature, the nitriding treatment, the oxidizing treatment, or the like can be performed at lower temperature than conventional plasma treatment or thermal oxidizing method. In the case of using a glass substrate as the substrate 201, the nitriding treatment or oxidizing treatment can be performed sufficiently even when the plasma treatment is performed at a temperature lower by 100° C. or more than a strain point of the glass substrate.

Figure 3C:
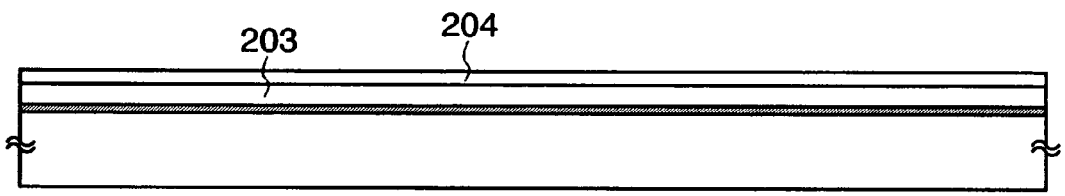

Next, a base insulating film 203 (hereinafter also referred to as an "insulating film 203") which functions as a base film is formed over the insulating film 202, and a semiconductor film 204 is formed over the insulating film 203 (FIG. 3C).

The insulating film 203 can be provided with a single-layer structure of an insulating film containing oxygen and/or nitrogen such as a silicon oxide ($SiO_X$) film, a silicon nitride ($SiN_X$) film, a silicon oxynitride ($SiO_XN_Y$) (X>Y) film, or a silicon nitride oxide ($SiN_XO_Y$) (X>Y) film or a stacked structure thereof. For example, in the case where the insulating film 203 has a two-layer structure, a silicon nitride oxide film may be provided as a first layer of the insulating film and a silicon oxynitride film may be provided as a second layer of the insulating film. In the case where the insulating film 203 has a three-layer structure, a silicon oxynitride film may be provided as a first layer of the insulating film, a silicon nitride oxide film is provided as a second layer of the insulating film, and a silicon oxynitride film may be provided as a third layer of the insulating film. Thus, the formation of the insulating film 203 functioning as a base film can suppress the diffusion of alkali metal such as Na or alkaline earth metal into the semiconductor film 204 from the substrate 201 and the adverse effect thereof on characteristics of a semiconductor element.

The semiconductor film 204 can be formed with an amorphous semiconductor or a semi-amorphous semiconductor (SAS). Alternatively, a polycrystalline semiconductor film may be used. The SAS has an intermediate structure between an amorphous structure and a crystalline structure (including a single crystal and a polycrystal) and a third state which is stable in terms of free energy, and it includes a crystalline region having short-range order and lattice distortion. In at least a part of a region of the film, a crystal region of 0.5 nm to 20 nm can be observed. In the case of containing silicon as a main component, a Raman spectrum due to L-O phonon is shifted to a lower wavenumber side than 520 $cm^{-1}$. A diffraction peak of (111) or (220) to be caused by a crystal lattice of silicon is observed in X-ray diffraction. Hydrogen or halogen of at least 1 atomic % or more is contained to terminate a dangling bond. The SAS is formed by performing glow discharge decomposition (plasma CVD) on a gas containing silicon. $SiH_4$ is given as the gas containing silicon. In addition, $Si_2H_6$, $SiH_2Cl_2$, $SiHCl_3$, $SiCl_4$, $SiF_4$, or the like can also be used as the gas containing silicon. In addition, $GeF_4$ may be mixed. The gas containing silicon may be diluted with $H_2$, or $H_2$ and one or more noble gas elements of He, Ar, Kr, and Ne. A dilution ratio thereof may range from 2 times to 1000 times; pressures, approximately 0.1 Pa to 133 Pa; and power supply frequency, 1 MHz to 120 MHz, preferably, 13 MHz to 60 MHz. A substrate heating temperature may be 300° C. or less. A concentration of an atmospheric constituent impurity such as oxygen, nitrogen, or carbon, as an impurity element in the film, is preferably $1 \times 10^{20}$ atoms/cm$^3$ or less; in particular, a concentration of oxygen is $5 \times 10^{19}$ atoms/cm$^3$ or less, preferably $1 \times 10^{19}$ atoms/cm$^3$ or less. Here, an amorphous semiconductor film is formed with a material containing silicon (Si) as its main component (such as $Si_xGe_{1-x}$) using a sputtering method, an LPCVD method, a plasma CVD method, or the like, and the amorphous semiconductor film is crystallized by a laser crystallization method, a thermal crystallization method using RTA or an annealing furnace, a thermal crystallization method using a metal element which promotes crystallization, or the like. In addition, the crystallization may be performed by generating thermal plasma by application of a DC bias and applying the thermal plasma to the semiconductor film.

Figure 3D:
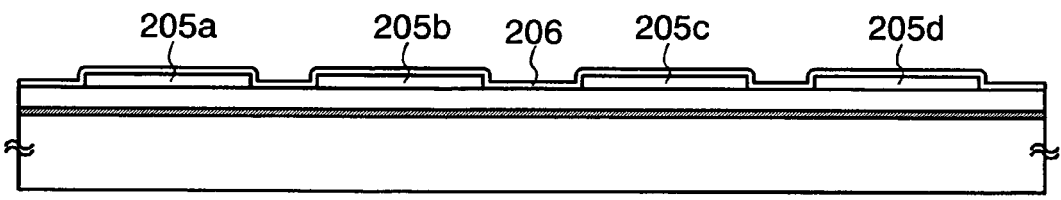

Next, the semiconductor film 204 is selectively etched to form island-like semiconductor films 205a to 205d, and a gate insulating film 206 is formed to cover the island-like semiconductor films 205a to 205d (FIG. 3D).

The gate insulating film 206 can be provided by a CVD method, a sputtering method, or the like to have a single-layer structure of an insulating film containing oxygen and/or nitrogen such as a silicon oxide (SiO$_X$) film, a silicon nitride (SiN$_X$) film, a silicon oxynitride (SiO$_X$N$_Y$) (X>Y) film, or a silicon nitride oxide (SiN$_X$O$_Y$) (X>Y) film or a laminated structure thereof. Alternatively, the gate insulating film can be formed by performing oxidizing treatment or nitriding treatment on the surface of the island-like semiconductor films 205a to 205d by performing high-density plasma treatment on the island-like semiconductor films 205a to 205d in an oxygen atmosphere (for example, an atmosphere containing oxygen (O$_2$) and a noble gas (including at least one of He, Ne, Ar, Kr, and Xe) or an atmosphere containing oxygen, hydrogen (H$_2$), and a noble gas) or a nitrogen atmosphere (for example, an atmosphere containing nitrogen (N$_2$) and a noble gas (including at least one of He, Ne, Ar, Kr, and Xe) or an atmosphere containing NH$_3$ and a noble gas). By performing oxidizing treatment or nitriding treatment on the surface of the island-like semiconductor films 205a to 205d by high-density plasma treatment, a gate insulating film can be formed. The gate insulating film formed with an oxidized layer or a nitrided layer formed by performing oxidizing treatment or nitriding treatment on the island-like semiconductor films 205a to 205d by high-density plasma treatment is superior in uniformity of thickness or the like to an insulating film formed by a CVD method, a sputtering method, or the like and has a dense film.

Figure 3E:
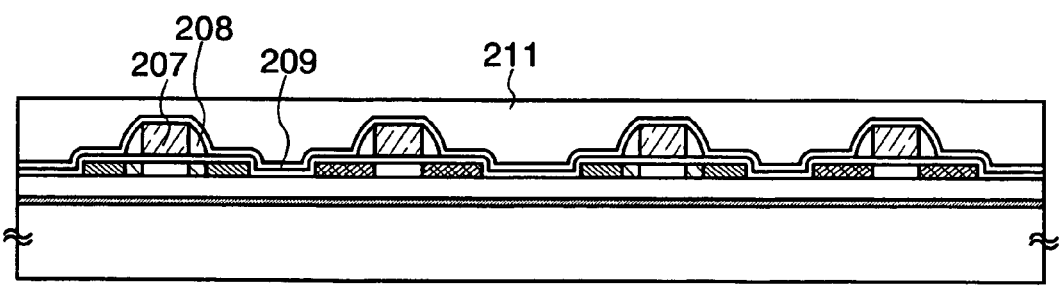

Next, a gate electrode 207 is selectively formed over the gate insulating film 206 and thereafter an insulating film 209 and an insulating film 211 are formed to cover the gate electrode 207. Note that a diagram is made here on an example of forming a side wall (hereinafter also an "insulating film 208") to be in contact with a side of the gate electrode 207 and providing LDD regions in the semiconductor films 205a and 205c located below the insulating film 208 in the N-channel thin film transistors 210a and 210c. (FIG. 3E)

The gate electrode 207 can be provided by a CVD method, a sputtering method, or the like with a single-layer structure or a laminated structure of an element selected from tantalum (Ta), tungsten (W), titanium (Ti), molybdenum (Mo), aluminum (Al), copper (Cu), chromium (Cr), niobium (Nb), and the like or an alloy material or a compound material containing the element as its main component. Alternatively, the gate electrode 207 can be formed with a semiconductor material typified by polycrystalline silicon which is doped with an impurity element such as phosphorus. For example, the gate electrode can be provided with a laminated structure of tantalum nitride and tungsten.

The insulating film 209 can be provided by a CVD method, a sputtering method, or the like to have a single-layer structure of an insulating film containing oxygen and/or nitrogen such as a silicon oxide (SiO$_X$) film, a silicon nitride (SiN$_X$) film, a silicon oxynitride (SiO$_X$N$_Y$) (X>Y) film, or a silicon nitride oxide (SiN$_X$O$_Y$) (X>Y) film or a film containing carbon such as a DLC (diamond like carbon) film or a laminated structure thereof.

The insulating film 211 can be provided by a CVD method, a sputtering method, or the like with a single-layer structure of an insulating film containing oxygen and/or nitrogen such as a silicon oxide (SiO$_X$) film, a silicon nitride (SiN$_X$) film, a silicon oxynitride (SiO$_X$N$_Y$) (X>Y) film, or a silicon nitride oxide (SiN$_X$O$_Y$) (X>Y) film or a film containing carbon such as a DLC (diamond like carbon) film, an organic material such as epoxy, polyimide, polyamide, polyvinyl phenol, benzocyclobutene, or acrylic, or a siloxane resin. Note that the siloxane resin corresponds to a resin having Si—O—Si bonds. Siloxane has a skeleton formed from a bond of silicon (Si) and oxygen (O). As a substituent, an organic group containing at least hydrogen (for example, an alkyl group or aromatic hydrocarbon) is used. As a substituent, a fluoro group can also be used. Alternatively, an organic group containing at least hydrogen and a fluoro group may be used as a substituent. Note that in the semiconductor device in FIG. 3E, the insulating film 211 can be provided directly to cover the gate electrode 207 without providing the insulating film 209.

Figure 4A:
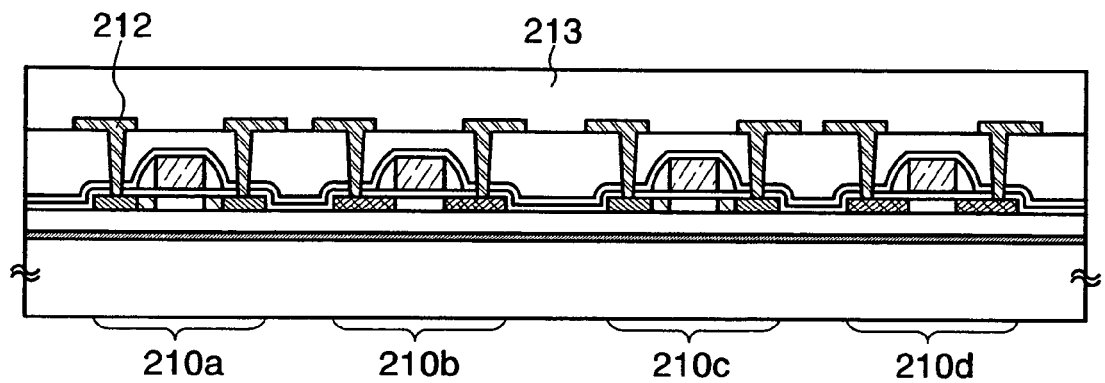
FIGS. 4A to 4C are diagrams showing an example of a method for manufacturing the semiconductor device of the present invention.

Next, a conductive film 212 is formed to electrically connect to a source region and a drain region of the island-like semiconductor films 205a to 205d over the insulating film 211, and an insulating film 213 is formed to cover the conductive film 212 (FIG. 4A). Thereby, thin film transistors 210a to 210d (hereinafter also referred to as N-channel thin film transistors 210a and 210c and P-channel thin film transistor 210b and 210d) are provided.

The conductive film 212 can be formed using a single-layer structure or a laminated structure of an element selected from aluminum (Al), tungsten (W), titanium (Ti), tantalum (Ta), molybdenum (Mo), nickel (Ni), platinum (Pt), copper (Cu), gold (Au), silver (Ag), manganese (Mn), neodymium (Nd), and carbon (C) or an alloy containing a plurality of the elements. For a conductive film formed of an alloy containing a plurality of the elements, an Al alloy containing C and Ti, an Al alloy containing Ni, an Al alloy containing C and Ni, an Al alloy containing C and Mn, or the like can be used. In addition, in the case of providing with a laminated structure, a laminated layer of Al and Ti can be provided.

The insulating film 213 can be provided by a CVD method, a sputtering method, or the like with a single-layer structure of an insulating film containing oxygen and/or nitrogen such as a silicon oxide (SiO$_X$) film, a silicon nitride (SiN$_X$) film, a silicon oxynitride (SiO$_X$N$_Y$) (X>Y) film, or a silicon nitride oxide (SiN$_X$O$_Y$) (X>Y) film or a film containing carbon such as a DLC (diamond like carbon) film, an organic material such as epoxy, polyimide, polyamide, polyvinyl phenol, benzocyclobutene, or acrylic, or a siloxane resin.

Figure 4B:
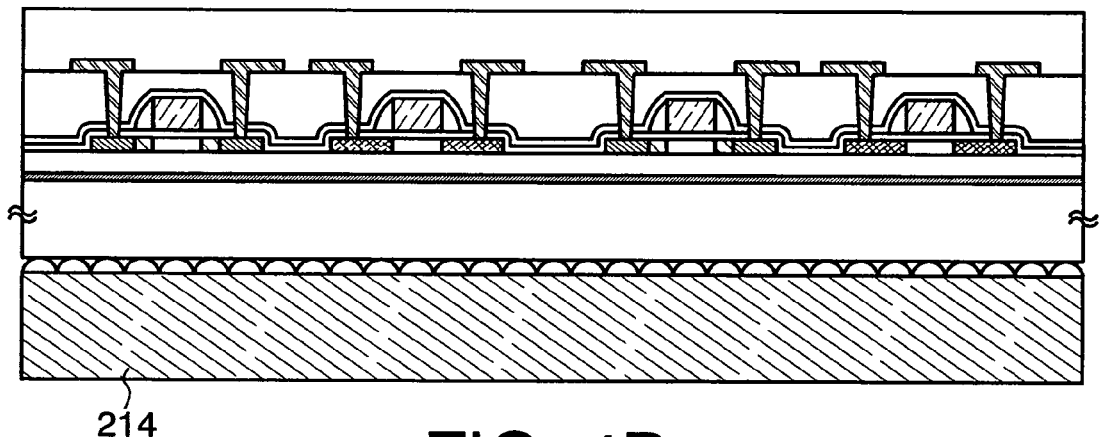

Next, the substrate 201 is thinned or removed by performing grinding treatment, polishing treatment, etching by chemical treatment, or the like on the other surface of the substrate 201 (a side opposite to the side provided with the insulating film 202) (see FIG. 4B). Here, an example of grinding the surface of substrate 201 using a grinding means 214 is described. Further, the surface of the substrate 201 is preferably further subjected to polishing treatment after grinding, and the surface shape of the substrate 201 can be unformed by performing polishing treatment after grinding treatment. Alternatively, the substrate may be thinned or removed by performing etching using chemical treatment after performing either or both grinding treatment and polishing treatment. Particularly in the case of removing the substrate 201, the substrate 201 can be efficiently removed by performing etching by chemical treatment after thinning the substrate to some extent by performing any or all of grinding treatment, polishing treatment, and the like.

Figure 4C:
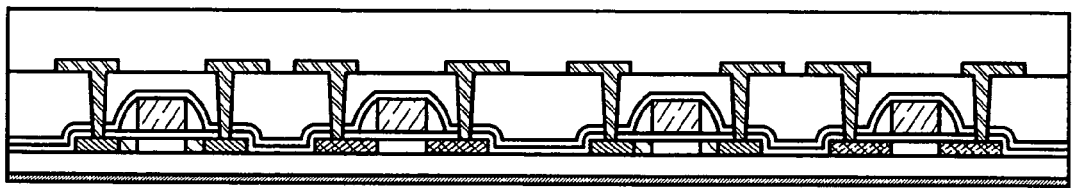

Through the above-described steps, a flexible semiconductor device can be obtained (FIG. 4C).

Figure 7A:
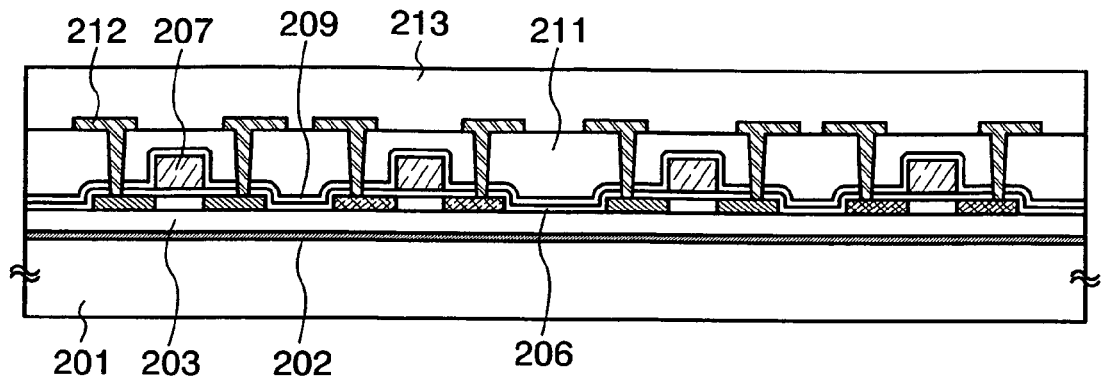
FIGS. 7A to 7C are diagrams showing examples of semiconductor devices of the present invention.
Figure 7B:
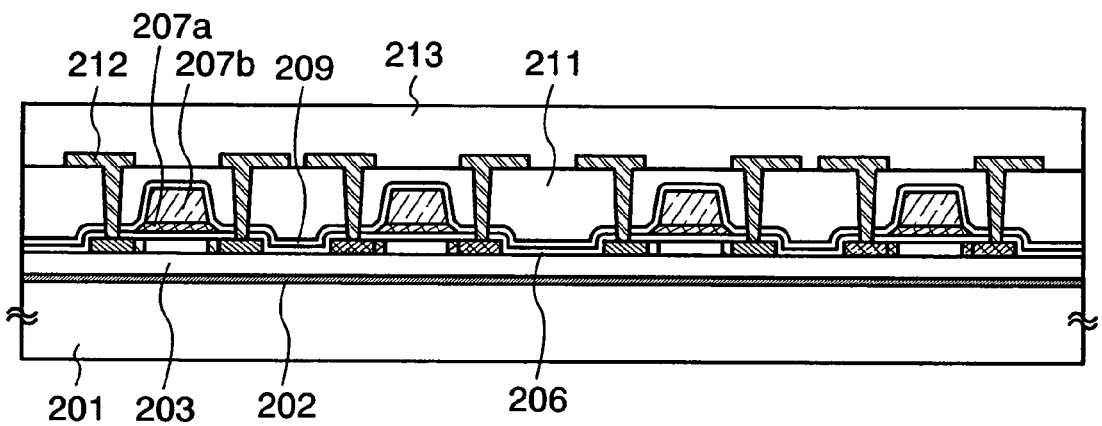
Figure 7C:
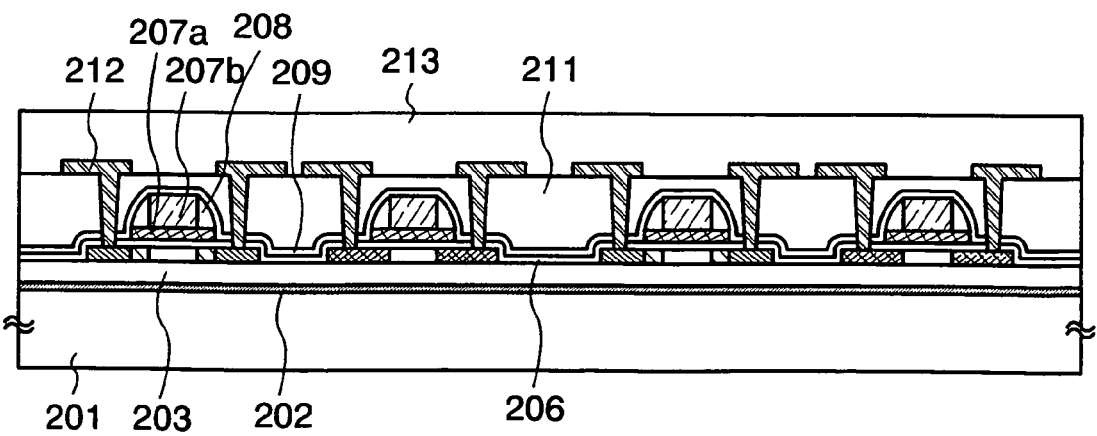

Note that the structure of the thin film transistor included in the semiconductor device of the present invention is not limited to that described above. For example, in FIG. 3E, the LDD regions are provided in the semiconductor films located below the sidewalls of the N-type thin film transistors 210a and 210c, and the LDD regions are not provided in the P-type thin film transistors 210b and 210d. However, the LDD regions may be provided in both of them, or the LDD regions and the sidewalls may be provided in neither of them (FIG. 7A). In addition, the structure of the thin film transistor is not limited to those described above, and the structure may be a single gate structure in which one channel formation region is formed, a multi-gate structure such as a double gate structure where two channel formation regions are formed or a triple gate structure where three channel formation region are formed. In addition, the structure may be a bottom gate structure or a dual gate structure including two gate electrodes positioned above and below a channel formation region with each a gate insulating film interposed therebetween. In addition, in the case of forming the gate electrode to have a laminated structure, the gate electrode can have a structure where the gate electrode is provided with a first conductive film 207a formed in a lower part of the gate electrode and a second conductive film 207b formed over the first conductive film 207a; the first conductive film 207a is formed to have a tapered shape; and an impurity region having a lower concentration than the impurity region functioning as a source or drain region is provided so as to overlap with only the first conductive film (FIG. 7B). In addition, in the case of forming the gate electrode to have a laminated structure, the gate electrode can have a structure where the gate electrode is provided with the first conductive film 207a formed in a lower part of the gate electrode and the second conductive film 207b formed over the first conductive film 207a; sidewalls 208 are formed so as to be in contact with a side wall of the second conductive film 207b and formed above the first conductive film 207a (FIG. 7C). In the above structure, an impurity region functioning as a source or drain region of the semiconductor film can also be formed with silicide of Ni, Co, W, Mo, or the like.

Subsequently, an example of a method for manufacturing a semiconductor device, which is different from that in FIGS. 3A to 4C, is explained with reference to FIGS. 5A to 5D. Specifically, the above-described manufacturing method in FIGS. 2A to 2E is explained in more detail.

Figure 5A:
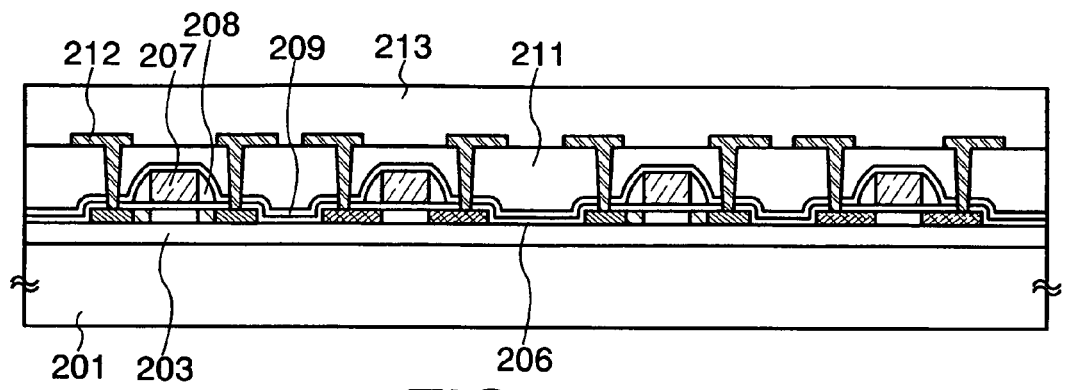
FIGS. 5A to 5D are diagrams showing an example of a method for manufacturing a semiconductor device of the present invention.

First, formation is performed as described above to the state shown in FIG. 4A. However, the insulating film 203 is directly formed here on the substrate 201 without performing surface treatment on the surface of the substrate 201 (FIG. 5A).

Figure 5B:
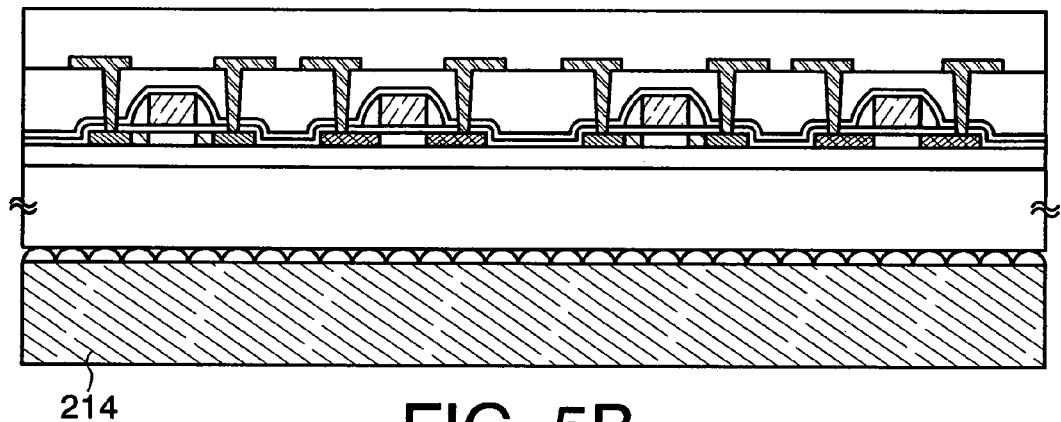
Figure 5C:
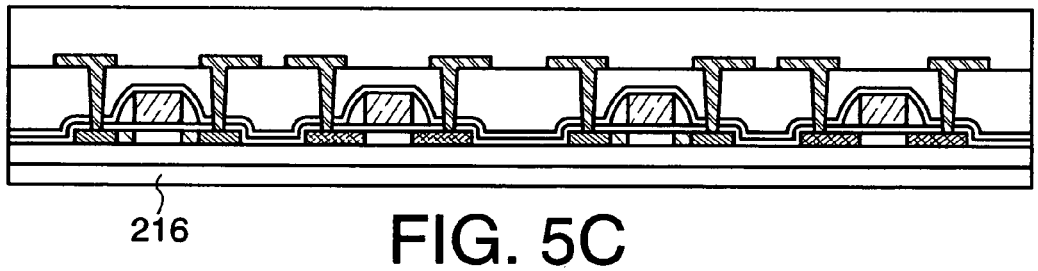

Next, the substrate 201 is thinned by performing any or all of grinding treatment, polishing treatment, etching by chemical treatment, and the like on one surface of the substrate 201 (a side opposite to the side provided with the insulating film 203) to form a substrate 216 (FIG. 5B). Here, an example of grinding the surface of the substrate 201 using a grinding means 214 is described. In addition, the surface shape of the substrate 201 can be uniformed by polishing the surface of the substrate 201 after grinding.

Figure 5D:
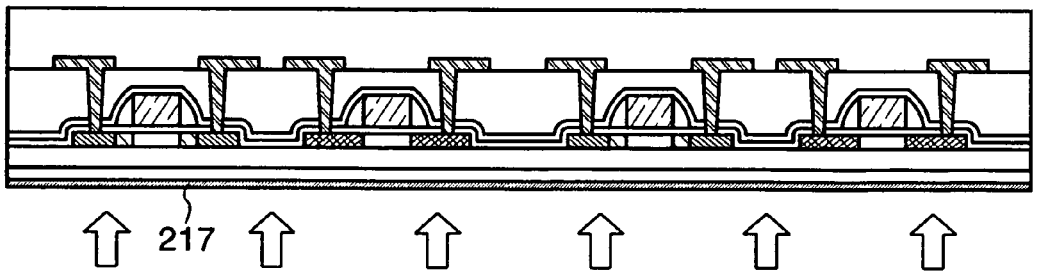

Next, surface treatment is performed on the thinned substrate 216 to form an insulating film functioning as a protective film (FIG. 5D). The surface treatment can be performed by using any of the above-mentioned methods, but here the surface treatment is preferably performed on the substrate 216 using high-density plasma treatment. An insulating film 217 functioning as a protective film can be provided using a CVD method, a sputtering method, or the like. However, in the case of using the above method, thin film transistors 210a to 210d and the like that are objects to be treated may be damaged due to the influence of treatment temperature or the like, and characteristics of the thin film transistors 210a to 210d may be adversely affected. On the other hand, in the case of performing high-density plasma treatment, plasma density is high and electron temperature in the vicinity of the object to be treated is low. Therefore, damage by plasma to the thin film transistors 210a to 210d and the like which are objects to be treated can be suppressed. In addition, because of high plasma density, a nitrided layer, an oxidized layer, or the like formed by performing nitriding treatment or oxidizing treatment on the object to be treated with the use of plasma treatment is superior in uniformity of thickness or the like to a film formed by a CVD method, a sputtering method, or the like, and a dense film can be formed. Here, a nitrided layer 217 (hereinafter also referred to as an "insulating film 217") which functions as a protective film is formed on the surface of the substrate 216 by performing high-density plasma treatment on the surface of the substrate 216 in a nitrogen atmosphere. In this case, the treated object (here, the insulating film 217 formed on the surface of the substrate 216) may contain a noble gas which is used for the plasma treatment, and for example, the treated object may contain Ar in the case of using Ar.

Figure 6A:
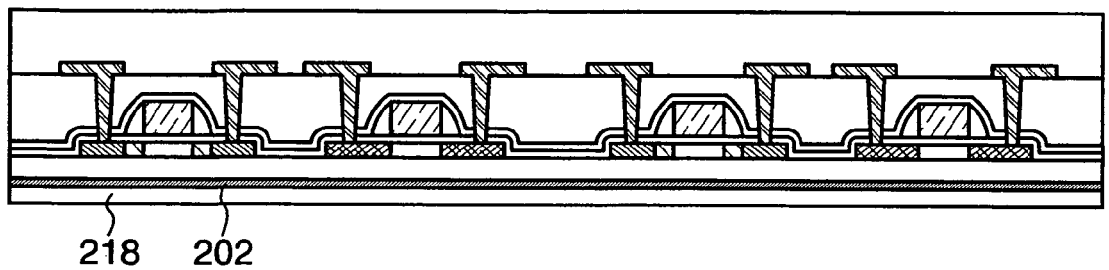
FIGS. 6A and 6B are diagrams showing examples of a semiconductor devices of the present invention.
Figure 6B:
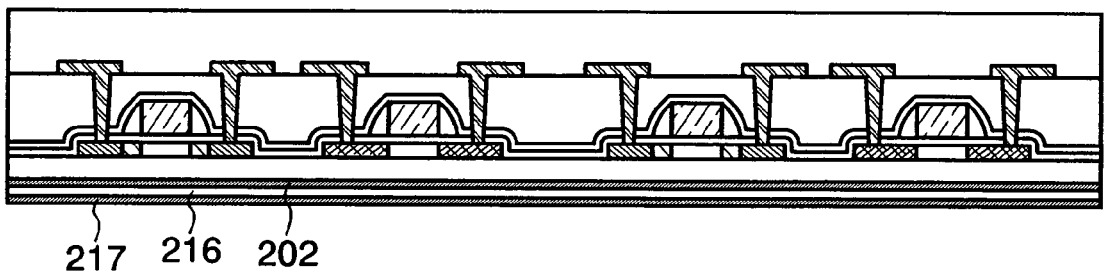

In addition, the semiconductor device of the present invention is not limited to the structures shown in FIGS. 3A to 5D, and can have, for example, structures shown in FIGS. 6A and 6B. The structure shown in FIG. 6A is a structure in which the substrate 201 is thinned in FIG. 4B so as to remain as a substrate 218 without being completely removed. In addition, the structure shown in FIG. 6A can be a structure in which surface treatment is performed on the surface of the substrate 218 (a side opposite to the side provided with the insulating film 202) to provide the insulating film 217 functioning as a protective film, as shown in FIG. 6B. In this case, the structure is a laminated structure of the insulating film 202 functioning as a protective film, the substrate 216, and the insulating film 217; therefore, the structure can more effectively prevent an impurity element, moisture, or the like from being mixed into a thin film transistor from outside. For example, in the case where the insulating film 202 and the insulating film 217 functioning as protective films are formed by performing nitriding treatment on a glass substrate, silicon oxide which form the substrate is sandwiched between nitrided layers in the structure of FIG. 6B.

In addition, the semiconductor device of the present invention can be applied to a semiconductor device which can transmit and receive data without contact (also referred to as an RFID (Radio Frequency Identification) tag, an ID tag, an IC tag, an IC chip, an RF (Radio Frequency) tag, a wireless tag, an electronic tag, or a wireless chip) and a display device including a pixel portion.

Figure 8A:
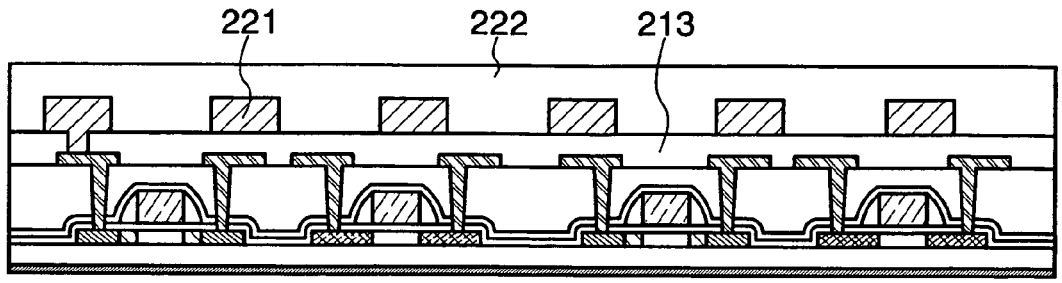
FIGS. 8A to 8D are diagrams showing examples of types of usage of a semiconductor device of the present invention.

For example, in FIGS. 4A to 4C, a conductive film 221 functioning as an antenna is formed over the insulating film 213, an insulating film 222 functioning as a protective film is formed to cover the conductive film 221, before thinning or removing the substrate 201 and subsequently, the substrate 201 is thinned or removed, thereby manufacturing a flexible semiconductor device which can transmit and receive data without contact (FIG. 8A).

The conductive film 221 is formed of a conductive material by using a CVD method, a sputtering method, a printing method such as screen printing or gravure printing, a droplet discharge method, a dispenser method, a plating method, or the like. The conductive material is an element selected from aluminum (Al), titanium (Ti), silver (Ag), copper (Cu), gold (Au), and nickel (Ni) or an alloy material or a compound material containing the element as its main component, and the conductive film is formed to have a single-layer structure or a laminated structure of the conductive material.

Figure 8B:
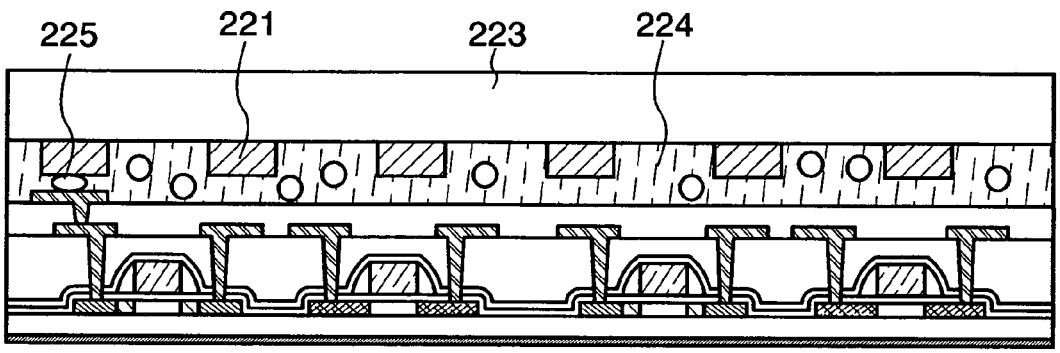

In addition, a flexible semiconductor device which can transmit and receive data without contact can be manufactured by attaching a substrate 223 provided with the conductive film 221 functioning as the antenna to a semiconductor element such as a thin film transistor provided over the substrate 201 so as to be electrically connected to each other before thinning or removing the substrate 201, and subsequently thinning or removing the substrate 201 (FIG. 8B).

For the substrate 223, an originally flexible material such as plastic may be used, or both the substrate 201 and the substrate 223 can be thinned or removed after being attached to each other; in the latter case, a material similar to the substrate 201 can be used for the substrate 223. In attaching the substrate 201 and the substrate 223, here, the semiconductor element and the conductive film 221 functioning as the antenna are connected to each other using conductive particles 225 included in an adhesive resin 224. Alternatively, they can be connected to each other using a conductive adhesive such as silver paste, copper paste, or carbon paste, an anisotropic conductive adhesive such as ACP (Anisotropic Conductive Paste), solder joint, or the like.

Figure 8C:
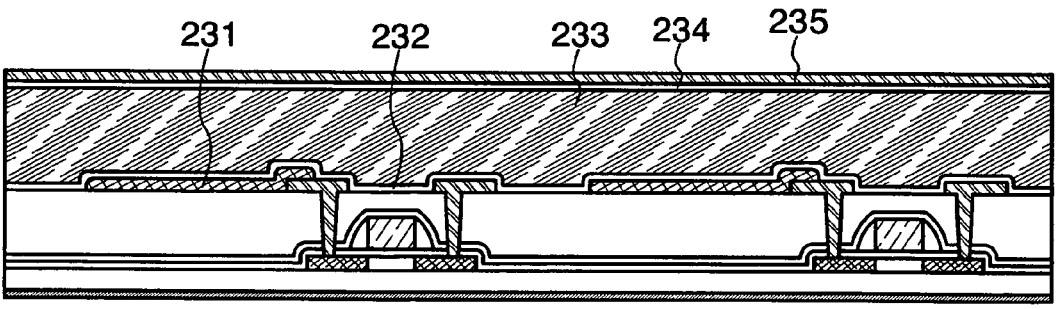
Figure 8D:
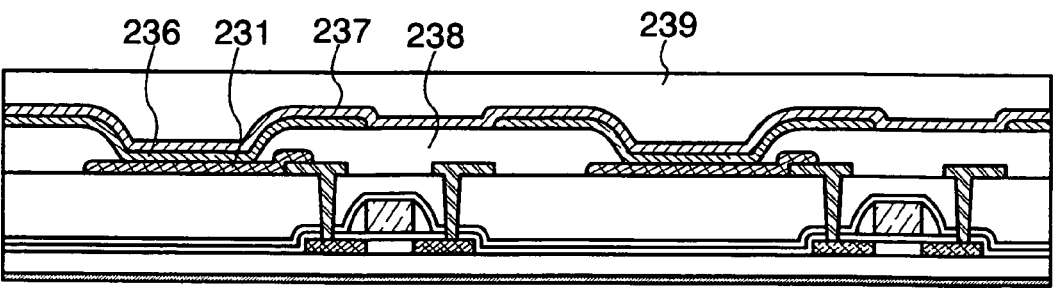

In addition, a semiconductor device including a pixel portion can be manufactured by providing a pixel electrode 231 over the insulating film 211 so as to be electrically connected to the conductive film 212 before thinning or removing the substrate 201 in FIGS. 4A to 4C. For example, a flexible liquid crystal display device can be manufactured by providing a liquid crystal material 233 over the pixel electrode 231 so as to be sandwiched between an orientation film 232 and an orientation film 234, and providing an opposite electrode 235 over the orientation film 234 (FIG. 8C). In addition, a flexible self-light emitting type display device can be manufactured by continuously laminating a light emitting layer 236 such as an organic EL layer and an opposite electrode 237 over the pixel electrode 231 (FIG. 8D). Note that in FIG. 8D, an insulating film 238 is provided as a partition for separating a plurality of pixels, and an insulating film 239 is provided as a protective film.

Note that this embodiment mode describes the example of using a thin film transistor as an element group in FIGS. 1A to 1E or FIGS. 2A to 2E, but this embodiment mode is not limited thereto. As described above, a field effect transistor (FET) using a semiconductor substrate of Si or the like as a channel, an organic TFT using an organic material as a channel, or the like can be used. Furthermore, a diode, a solar cell, or the like can be provided besides the transistor.

For example, in the case of using a semiconductor substrate of Si or the like as the substrate 201, after forming a transistor using the semiconductor substrate as a channel region over one side of the substrate 201 and thinning the substrate 201 from the other side, surface treatment is performed on the surface of the thinned substrate 201 to form an insulating film functioning as a protective film. The surface treatment can be performed using any of the above-mentioned methods, but high-density plasma treatment is preferably performed since damage to the transistor can be suppressed.

Note that this embodiment mode can be freely combined with another embodiment mode described in this specification.

Embodiment Mode 2

In this embodiment mode, an example of an apparatus in the case of performing plasma treatment in the above embodiment mode is explained with reference to drawings.

Figure 19A:
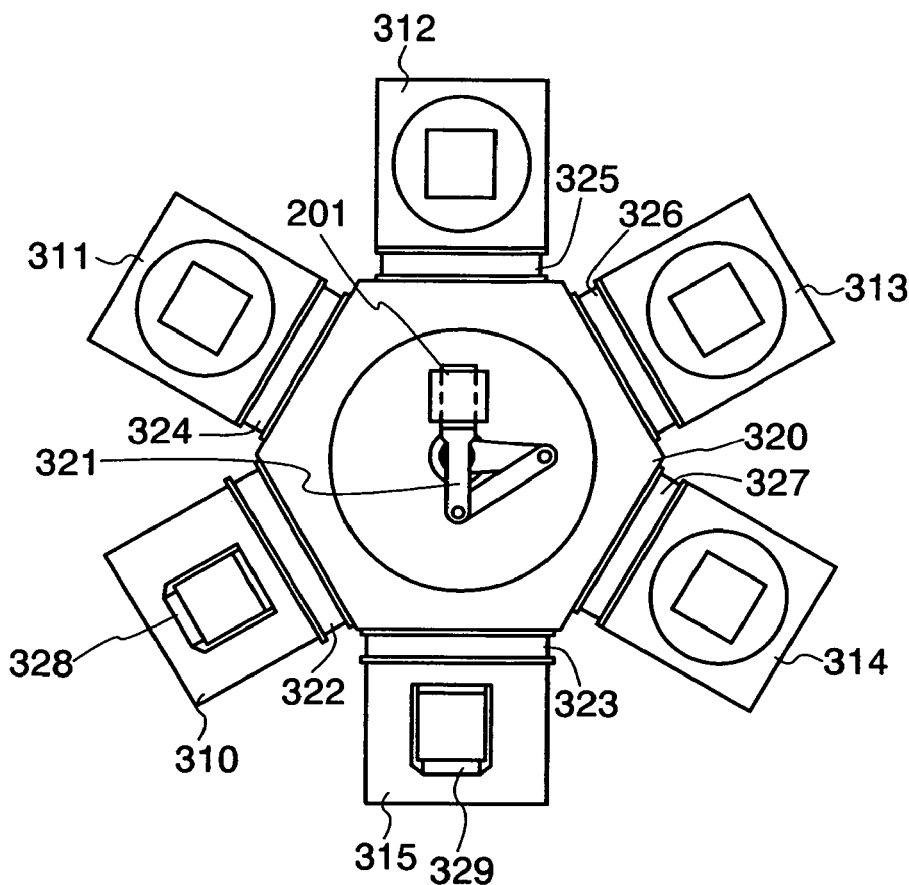
FIGS. 19A and 19B are diagrams showing an example of an apparatus for manufacturing a semiconductor device of the present invention.

A plasma treatment apparatus shown in FIG. 19A includes a plurality of treatment chambers capable of generating plasma, a common chamber for transferring a substrate to each chamber, and a load lock chamber for taking in or out the substrate. Thus, in the case of continuously performing formation of an insulating film, a conductive film, or a semiconductor film and plasma treatment thereof, a plasma treatment apparatus including a plurality of treatment chambers can be used. Note that FIG. 19A is a top plan view showing one exemplary structure of a plasma treatment apparatus described in this embodiment mode.

The plasma treatment apparatus shown as an illustrative example in FIG. 19A includes a first treatment chamber 311, a second treatment chamber 312, a third treatment chamber 313, a fourth treatment chamber 314, load lock chambers 310 and 315, and a common chamber 320. Each treatment chamber has airtightness. Each treatment chamber is provided with a vacuum evacuation means, a gas introduction means, and a plasma generation means.

The load lock chambers 310 and 315 are chambers for transferring a sample (substrate to be treated) to each chamber. The common chamber 320 is provided in common for each of the load lock chambers 310 and 315 and the first to fourth treatment chambers 311 to 314. A substrate 201 is transferred to each treatment chamber from the load lock chambers 310 and 315 via the common chamber 320. The first to fourth treatment chambers are chambers for performing formation treatment of a conductive film, an insulating film, or a semiconductor film, etching treatment, plasma treatment, or the like on the substrate 201. Note that the common chamber 320 is provided with a robot arm 321, with which the substrate 201 is transferred to each chamber.

Gate valves 322 to 327 are respectively provided between the common chamber 320 and the first treatment chamber 311, the second treatment chamber 312, the third treatment chamber 313, the fourth treatment chamber 314, and the load lock chambers 310 and 315.

The first treatment chamber 311, the second treatment chamber 312, the third treatment chamber 313, and the fourth treatment chamber 314 have different internal structures in accordance with the intended use. As the kind of treatment, there is plasma treatment, film formation treatment, heat treatment, etching treatment, or the like.

Figure 19B:
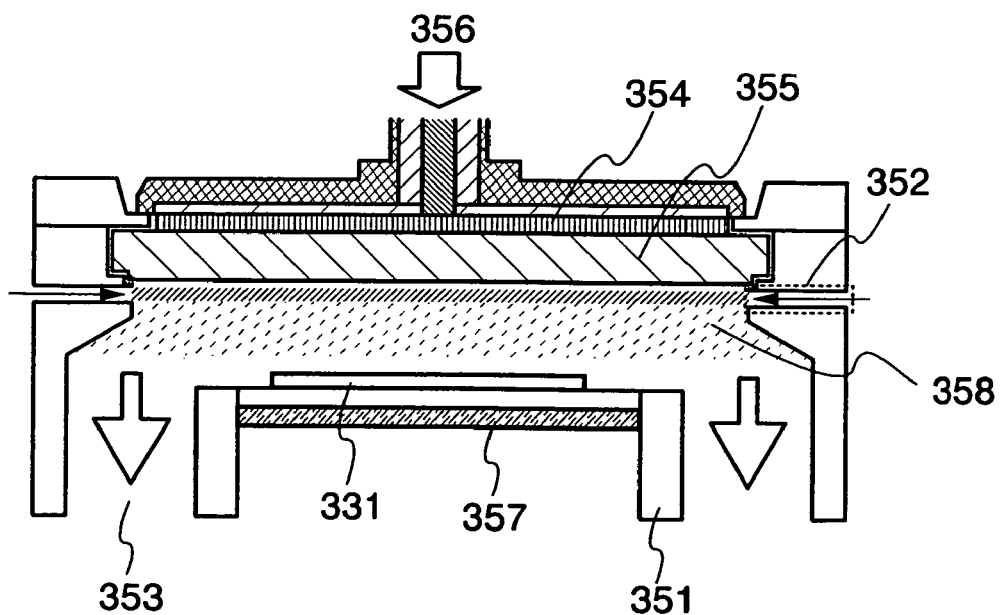

FIG. 19B shows an exemplary internal structure of the treatment chamber for performing plasma treatment. The inside of the treatment chamber is provided with a supporting base 351 for positioning a substrate 331 to be subjected to plasma treatment, a gas supply portion 352 for introducing a gas, an exhaust outlet 353, an antenna 354, a dielectric plate 355, and a high-frequency supply portion 356 for supplying a high frequency wave for generating plasma. In addition, the temperature of the substrate to be treated 331 can be controlled by providing the supporting base 351 with a temperature control portion 357. An example of the plasma treatment is explained below.

Here, plasma treatment includes oxidizing treatment, nitriding treatment, oxynitriding treatment, hydrogenating treatment, and surface modification treatment on a semiconductor film, an insulating film, or a conductive film. Such treatment may be performed by selecting an appropriate gas in accordance with the intended use.

For example, the oxidizing treatment or nitriding treatment may be performed in the following manner. First, the treatment chamber is evacuated, and a gas containing oxygen or nitrogen is introduced from the gas supply portion 352. As the gas containing oxygen, for example, a mixed gas of oxygen ($O_2$) and a noble gas or a mixed gas of oxygen, hydrogen, and a noble gas can be introduced. In addition, as the gas containing nitrogen, a mixed gas of nitrogen and a noble gas or a mixed gas of an ammonia gas and a noble gas can be introduced. Next, the substrate to be treated 331 is placed on the supporting base 351 including the temperature control portion 357, and the substrate to be treated 331 is heated to a temperature of 100° C. to 550° C. Note that the distance between the substrate to be treated 331 and the dielectric plate 355 are set to be in the range of 20 mm to 80 mm (preferably, 20 mm to 60 mm).

Next, a microwave is supplied to the antenna 354 from the high-frequency supply portion 356. Here, a microwave with a frequency of 2.45 GHz is supplied. By introducing the microwave into the treatment chamber through the dielectric plate 355 from the antenna 354, high-density plasma 358 which is activated by plasma excitation is generated. When plasma excitation is performed by introducing a microwave, plasma with high electron density (of $1 \times 10^{11}$ cm$^{-3}$ or more) can be generated at low electron temperature (of 3 eV or less, preferably, 1.5 eV or less). With an oxygen radical (which may contain an OH radical) or a nitrogen radical (which may contain an NH radical) generated by such low-electron-temperature and high-density plasma, nitriding treatment or oxidizing treatment can be performed without damaging the substrate to be treated 331 by performing plasma treatment on the surface of the substrate to be treated 331.

For example, in the case of performing plasma treatment in an atmosphere containing an $NH_3$ gas and an Ar gas, high-density excited plasma in which an $NH_3$ gas is mixed with an Ar gas is generated with a microwave. In the high-density excited plasma in which an $NH_3$ gas is mixed with an Ar gas, a radical is produced by excitation of the Ar gas with the introduced microwave. The Ar radical collides with $NH_3$ molecules, thereby producing a nitrogen radical (which may contain an NH radical). The radical reacts with the substrate to be treated 331; accordingly, the substrate to be treated 331 can be nitrided. Thereafter, the $NH_3$ gas and the Ar gas are exhausted to the outside of the treatment chamber through the exhaust outlet 353. Meanwhile, in the case of introducing oxygen, nitrous oxide, or the like, an oxygen radical (which may contain an OH radical) is produced; accordingly, the substrate to be treated 331 or a coating film over the substrate to be treated 331 can be oxidized.

Also in manufacturing a transistor over the substrate 201, for example, a semiconductor film can be directly oxidized, nitrided, or oxynitrided by solid-phase reaction with such high-density plasma to form a gate insulating film. In addition, a gate insulating film can be obtained by depositing and stacking an insulating film formed of silicon oxide, silicon oxynitride, silicon nitride, or the like by a CVD method utilizing plasma or thermal reaction, over the insulating film which is formed on the semiconductor film by solid-phase reaction with high-density plasma. In any case, a field effect transistor, which is formed to include an insulating film formed with high-density plasma in a part or the whole of the gate insulating film, can be reduced in variation of characteristics.

As a specific example, explanation is made below of an example of performing plasma treatment on the substrate 201 in the first treatment chamber 311, forming the insulating film 203 in the second treatment chamber 312, and performing plasma treatment in the third chamber 313, and forming the semiconductor film 204 in the fourth treatment chamber 314 in FIGS. 3A to 3E.

First, a cassette 328, which stores a number of the substrates 201, is carried into the load lock chamber 310. After the cassette 328 is carried in, a loading door of the load lock chamber 310 is closed. With this condition, the gate valve 322 is opened to take out one substrate to be treated from the cassette 328, which is then positioned in the common chamber 320 with the robot arm 321. In this case, positioning of the substrate 201 is carried out in the common chamber 320.

Next, the gate valve 322 is closed, and the gate valve 324 is opened. Then, the substrate 201 is transferred to the first treatment chamber 311. In the first treatment chamber 311, the substrate 201 is oxidized or nitrided by performing plasma treatment on the substrate 201. Here, the nitrided layer 202 containing nitride is formed on the surface of the substrate 201 by performing plasma treatment in a nitrogen atmosphere in the first treatment chamber 311.

After forming the nitrided layer on the surface of the substrate 201, the substrate 201 is extracted to the common chamber 320 with the robot arm 321 and is transferred to the second treatment chamber 312. In the second treatment chamber 312, film formation treatment is performed at a temperature of 150° C. to 300° C. to form the insulating film 203. The insulating film 203 can be formed to have a single-layer structure of an insulating film containing oxygen and/or nitrogen such as silicon oxide ($SiO_X$), silicon nitride ($SiN_X$), silicon oxynitride ($SiO_XN_Y$) (X>Y), or silicon nitride oxide ($SiN_XO_Y$) (X>Y), or a laminated structure thereof. Here, a silicon nitride oxide film is formed as a first layer of the insulating film, and a silicon oxynitride film is formed as a second layer of the insulating film, by a plasma CVD method in the second treatment chamber 312. Note that the film formation method is not limited to the plasma CVD method, and a sputtering method using a target may be used as well.

After forming the insulating film 203, the substrate 201 is extracted to the common chamber 320 with the robot arm 321 and is then transferred to the third treatment chamber 313. In the third treatment chamber 313, the insulating film 203 is oxidized or nitrided by performing plasma treatment on the insulating film 203. Here, the surface of the insulating film 203 is oxidized by performing plasma treatment in an oxygen atmosphere (for example, in an atmosphere containing oxygen and a noble gas, an atmosphere containing oxygen, hydrogen, and a noble gas, or an atmosphere containing dinitrogen monoxide and a noble gas) in the third treatment chamber 313.

After oxidizing the insulating film 203, the substrate 201 is extracted to the common chamber 320 with the robot arm 321 and is then transferred to the fourth treatment chamber 314. In the fourth treatment chamber 314, film formation treatment is performed at a temperature of 150° C. to 300° C. to form the semiconductor film 204 by a plasma CVD method. Note that the semiconductor film 204 may be a microcrystalline semiconductor film, an amorphous germanium film, an amorphous silicon germanium film, a laminated film thereof, or the like. Heat treatment for reducing hydrogen concentration may be omitted by setting the formation temperature of the semiconductor film at 350° C. to 500° C. Note that, although the case of forming the semiconductor film by using a plasma CVD method is described here, a sputtering method using a target may be used as well.

In this manner, after forming the semiconductor film, the substrate 201 is transferred to the load lock chamber 315 with the robot arm 321 and is stored in the cassette 329.

Note that FIG. 19A merely shows an example. For example, a conductive film or an insulating film may be subsequently formed using a fifth treatment chamber after forming the semiconductor film, and the number of treatment chambers can further be increased. In addition, separately from the treatment chamber for performing plasma treatment, a treatment chamber for performing heat treatment such as RTA can be provided and utilized for heat treatment in a manufacturing process of a semiconductor device. In addition, FIG. 19A shows an example of using the first treatment chamber 311 to the fourth treatment chamber 314, each of which is a single type treatment chamber. However, a structure in which multiple substrates are treated at a time may be employed using a batch type treatment chamber.

Note that this embodiment mode can be freely combined with the above embodiment mode. In other words, the material or the formation method described in the above embodiment mode can be used in combination also in this embodiment mode, and the material or the formation method described in this embodiment mode can be used in combination also in the above embodiment mode.

Embodiment Mode 3

In this embodiment mode, a method for manufacturing a semiconductor device, which is different from that in the above embodiment modes, is explained with reference to drawings. Specifically, a method for manufacturing a semiconductor device of the present invention including a thin film transistor, a storage element, and an antenna is explained with reference to drawings.

Figure 9A:
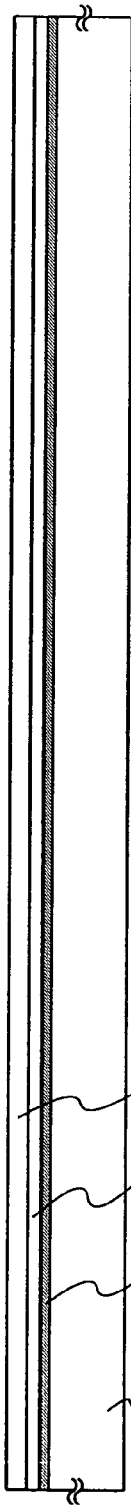
FIGS. 9A to 9C are diagrams showing an example of a method for manufacturing a semiconductor device of the present invention.

First, one surface of a substrate 701 is subjected to plasma treatment in a nitrogen atmosphere to form a nitrided layer 702 (hereinafter also referred to as an insulating film 702). Subsequently, an insulating film 703 serving as a base film and an amorphous semiconductor film 704 (for example, a film containing amorphous silicon) are formed (FIG. 9A).

As the substrate 701, a glass substrate, a quartz substrate, a metal substrate, or a stainless steel substrate provided with an insulating film on one surface thereof, a heat-resistant plastic substrate which can withstand a processing temperature of the present process, or the like may be used. Since there is no significant limitation on the area or shape of the substrate 701, productivity can be drastically improved when using, for example, a rectangular substrate having a side of one meter or more as the substrate 701. Alternatively, a semiconductor substrate of Si or the like may be used.

The insulating film 703 can be provided by a CVD method, a sputtering method, or the like to have a single-layer structure or a multi-layer structure of an insulating film containing oxygen and/or nitrogen such as a silicon oxide ($SiO_X$) film, a silicon nitride ($SiN_X$) film, a silicon oxynitride ($SiO_XN_Y$) (X>Y) film, or a silicon nitride oxide ($SiN_XO_Y$) (X>Y) film. In the case where the insulating film serving as a base has a two-layer structure, for example, a silicon nitride oxide film may be formed as a first layer and a silicon oxynitride film may be formed as a second layer. In the case where the insulating film serving as the base film has a three-layer structure, a silicon oxide film may be formed as a first layer of the insulating film, a silicon nitride oxide film may be formed as a second layer of the insulating film, and a silicon oxynitride film may be formed as a third layer of the insulating film. Alternatively, a silicon oxynitride film may be formed as a first layer of the insulating film, a silicon nitride oxide film may be formed as a second layer of the insulating film, and a silicon oxynitride film may be formed as a third layer of the insulating film. The insulating film serving as the base film functions as a blocking film which prevents the entry of an impurity from the substrate 701.

Figure 9B:
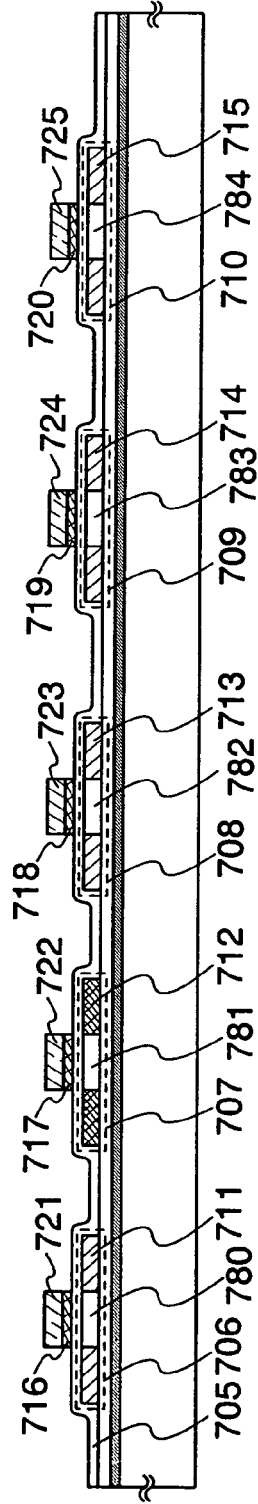

Subsequently, an amorphous semiconductor film 704 (for example, a film containing amorphous silicon) is formed over the insulating film 703. The amorphous semiconductor film 704 is formed by a sputtering method, an LPCVD method, a plasma CVD method, or the like with a thickness of 25 nm to 200 nm (preferably, 30 nm to 150 nm). Subsequently, the amorphous semiconductor film 704 is crystallized by a known crystallization method (a laser crystallization method, a thermal crystallization method using RTA or an annealing furnace, a thermal crystallization method using a metal element which promotes crystallization, or a combination of a thermal crystallization method using a metal element which promotes crystallization and a laser crystallization method) to form a crystalline semiconductor film. Thereafter, the obtained crystalline semiconductor film is etched into a desired shape to form crystalline semiconductor films 706 to 710 (FIG. 9B).

An example of a manufacturing process of the crystalline semiconductor films 706 to 710 is briefly explained below. First, an amorphous semiconductor film with a thickness of 66 nm is formed using a plasma CVD method. After applying a solution containing nickel which is a metal element for promoting crystallization so as to remain over the amorphous semiconductor film, the amorphous semiconductor film is subjected to dehydrogenating treatment (500° C. for one hour) and thermal crystallizing treatment (550° C. for four hours) to form a crystalline semiconductor film. Thereafter, the crystalline semiconductor film is irradiated with a laser beam, if required, to form the crystalline semiconductor films 706 to 710 by a photolithography method.

In the case of forming a crystalline semiconductor film by a laser crystallization method, a continuous wave laser beam (CW laser beam) or a pulsed laser beam (pulse laser beam) can be used. As a laser beam which can be used here, a beam emitted from one or plural kinds of a gas laser such as an Ar laser, a Kr laser, or an excimer laser; a laser using, as a medium, single crystalline YAG, $YVO_4$, forsterite ($Mg_2SiO_4$), $YAlO_3$, or $GdVO_4$ or polycrystalline (ceramic) YAG, $Y_2O_3$, $YVO_4$, $YAlO_3$, or $GdVO_4$ doped with one or more of Nd, Yb, Cr, Ti, Ho, Er, Tm, and Ta as a dopant; a glass laser; a ruby laser; an alexandrite laser; a Ti:sapphire laser; a copper vapor laser; and a gold vapor laser, can be used. An object is irradiated with a laser beam of a fundamental wave of such lasers or a second to fourth harmonic of such a fundamental wave, so that a crystal with a large grain size can be obtained. For example, the second harmonic (532 nm) or the third harmonic (355 nm) of an Nd:$YVO_4$ laser (fundamental wave of 1064 nm) can be used. An energy density of the laser at this time is required to be approximately 0.01 MW/cm$^2$ to 100 MW/cm$^2$ (preferably 0.1 MW/cm$^2$ to 10 MW/cm$^2$). The irradiation is performed with the scanning rate set at approximately 10 cm/sec to 2000 cm/sec. Note that each laser using, as a medium, single crystalline YAG, $YVO_4$, forsterite ($Mg_2SiO_4$), $YAlO_3$, or $GdVO_4$ or polycrystalline (ceramic) YAG, $Y_2O_3$, $YVO_4$, $YAlO_3$, or $GdVO_4$ doped with one or more of Nd, Yb, Cr, Ti, Ho, Er, Tm, and Ta as a dopant; an Ar ion laser; and a Ti:sapphire laser, can continuously oscillate. Further, pulse oscillation thereof can be performed with a repetition rate of 10 MHz or more by performing Q switch operation or mode locking. When a laser beam is oscillated at a repetition rate of 10 MHz or more, a semiconductor film is irradiated with a next pulse during a period during the semiconductor film is melted by the laser beam and then is solidified. Therefore, unlike the case of using a pulsed laser having a low repetition rate, the interface between the solid phase and the liquid phase can be moved continuously in the semiconductor film, and the semiconductor film having crystal grains grown continuously in the scanning direction can be formed.

The crystallization of the amorphous semiconductor film using a metal element for promoting crystallization has the advantages of enabling crystallization at a low temperature in a short time and aligning a direction of crystals; on the other hand, the crystallization has the disadvantage that off current is increased due to the metal element remaining in the crystalline semiconductor film and characteristics of the crystalline semiconductor film are not stabilized. Therefore, an amorphous semiconductor film serving as a gettering site is preferably formed over the crystalline semiconductor film. Since the amorphous semiconductor film serving as a gettering site is necessary to contain an impurity element such as phosphorus or argon, the amorphous semiconductor film is preferably formed by a sputtering method by which the amorphous semiconductor film can contain argon at high concentration. Thereafter, heat treatment (thermal annealing using an RTA method, an annealing furnace, or the like) is performed to diffuse a metal element into the amorphous semiconductor film. Subsequently, the amorphous semiconductor film containing the metal element is removed. This makes it possible to reduce or remove the metal element contained in the crystalline semiconductor film.

Next, a gate insulating film 705 is formed to cover the crystalline semiconductor films 706 to 710. The gate insulating film 705 is formed by using a single layer or a laminated layer of a film containing oxide of silicon and/or nitride of silicon by a CVD method, a sputtering method, or the like. Specifically, the gate insulating film 705 is formed by using a single layer or a laminated layer of a film containing silicon oxide, a film containing silicon oxynitride, or a film containing silicon nitride oxide.

Alternatively, the gate insulating film 705 may be formed by performing the above-mentioned high-density plasma treatment on the crystalline semiconductor films 706 to 710 and oxidizing or nitriding the surface. For example, the gate insulating film 705 is formed by plasma treatment with an introduced mixed gas of a noble gas such as He, Ar, Kr, or Xe and oxygen, nitrogen oxide ($NO_2$), ammonia, nitrogen, hydrogen, or the like. When plasma excitation in this case is performed by introducing a microwave, high-density plasma can be produced at low electron temperature. The surface of the semiconductor films can be oxidized or nitrided with an oxygen radical (which may contain an OH radical) or a nitrogen radical (which may contain an NH radical) that is produced by the high-density plasma.

By treatment using such high-density plasma, an insulating film with a thickness of 1 nm to 20 nm, typically, 5 nm to 10 nm, is formed over the semiconductor films. A reaction in this case is a solid-phase reaction; therefore, interface state density between the insulating film and the semiconductor films can be extremely lowered. Since such high-density plasma treatment directly oxidizes (or nitrides) the semiconductor films (of crystalline silicon or polycrystalline silicon), variation in thickness of the insulating film to be formed can be ideally suppressed significantly. Furthermore, oxidation is not performed strongly also at a crystal grain boundary of crystalline silicon, which leads to an extremely preferable state. In other words, when each surface of the semiconductor films is subjected to solid-phase oxidation by the high-density plasma treatment shown here, an insulating film with low interface state density and favorable uniformity can be formed without causing abnormal oxidation reaction at a crystal grain boundary.

As the gate insulating film, only an insulating film formed by high-density plasma treatment may be used. In addition, an insulating film of silicon oxide, silicon oxynitride, or silicon nitride may be deposited or laminated thereover by a CVD method utilizing plasma or a thermal reaction. In either case, a transistor which is formed to include an insulating film formed with high-density plasma in a part or the whole of the gate insulating film can reduce variations in characteristics.

The crystalline semiconductor films 706 to 710, which are formed by crystallizing the semiconductor film by irradiation with a continuous wave laser beam or a laser beam oscillated at a repetition rate of 10 MHz or more while scanning the semiconductor film with the laser beam in one direction, have a feature that crystals grow in a scanning direction of the laser beam. When transistors are arranged such that the scanning direction is aligned with each a channel length direction (a direction in which carries flow when a channel formation region is formed) and the transistor is combined with the gate insulating film, transistors (TFTs) with little variation in characteristics and high electron field-effect mobility can be obtained.

Next, a first conductive film and a second conductive film are laminated over the gate insulating film 705. The first conductive film is formed by a plasma CVD method, a sputtering method, or the like with a thickness of 20 nm to 100 nm. The second conductive film is formed by a known method with a thickness of 100 nm to 400 nm. The first conductive film and the second conductive film are formed with an element selected from tantalum (Ta), tungsten (W), titanium (Ti), molybdenum (Mo), aluminum (Al), copper (Cu), chromium (Cr), niobium (Nb), and the like; or an alloy material or a compound material containing the element as its main component. Alternatively, the first conductive film and the second conductive film are formed with a semiconductor material typified by polycrystalline silicon doped with an impurity element such as phosphorus. As an example of a combination of the first conductive film and the second conductive film, a tantalum nitride (TaN) film and a tungsten (W) film, a tungsten nitride (WN) film and a tungsten film, a molybdenum nitride (MoN) film and a molybdenum (Mo) film, or the like can be given. Since tungsten and tantalum nitride have high heat resistance, heat treatment for thermal activation can be performed after forming the first conductive film and the second conductive film. In the case of not a two-layer structure but a three-layer structure, a laminated structure of a molybdenum film, an aluminum film, and a molybdenum film may be employed.

Next, a mask of resist is formed using a photolithography method and etching treatment for forming a gate electrode and a gate line is performed to form conductive films 716 to 725 functioning as gate electrodes.

Then, a mask of resist is formed by a photolithography method and an impurity element which imparts N-type conductivity is added to the crystalline semiconductor films 706 and 708 to 710 at low concentration by an ion doping method or an ion implantation method to form N-type impurity regions 711 and 713 to 715 and channel formation regions 780 and 782 to 784. As the impurity element which imparts N-type conductivity, an element belonging to Group 15 may be used and, for example, phosphorus (P) or arsenic (As) is used.

Thereafter, a mask of resist is formed by a photolithography method and an impurity element which imparts P-type conductivity is added to the crystalline semiconductor film 707 to form a P-type impurity region 712 and a channel formation region 781. As the impurity element which imparts P-type conductivity, for example, boron (B) is used.

Figure 9C:
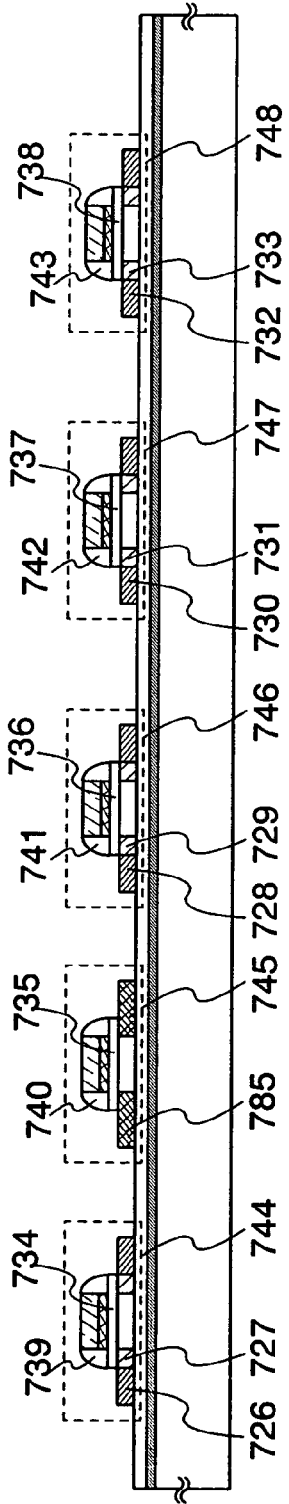

Next, an insulating film is formed to cover the gate insulating film 705 and the conductive films 716 to 725. The insulating film is formed by using a single layer or a laminated layer of a film containing an inorganic material such as silicon, oxide of silicon, and/or nitride of silicon or a film containing an organic material such as an organic resin by a plasma CVD method, a sputtering method, or the like. Next, the insulating film is selectively etched by anisotropic etching, by which etching is performed mainly in a perpendicular direction, to form insulating films (also referred to as sidewalls) 739 to 743 in contact with side faces of the conductive films 716 to 725 (FIG. 9C). At the same time as the manufacturing of the insulating films 739 to 743, the gate insulating film 705 is etched to form insulating films 734 to 738. The insulating films 739 to 743 are used as masks for doping when forming source and drain regions later.

Subsequently, with the use of the mask of resist formed by a photolithography method and the insulating films 739 to 743 as masks, an impurity element which imparts N-type conductivity is added to the crystalline semiconductor films 706 and 708 to 710 to form first N-type impurity regions 727, 729, 731, and 733 serving as LDD (Lightly Doped Drain) regions and second N-type impurity regions 726, 728, 730, and 732. The concentration of the impurity element contained in the first N-type impurity regions 727, 729, 731, and 733 is lower than that in the second N-type impurity regions 726, 728, 730, and 732. Through the above steps, N-type thin film transistors 744 and 746 to 748 and a P-type thin film transistor 745 are completed.

Note that there is a technique using the sidewall insulating film as a mask in order to form the LDD region. With the technique using the sidewall insulating film as a mask, a width of the LDD region can be easily controlled, and the LDD region can be formed certainly.

Figure 10A:
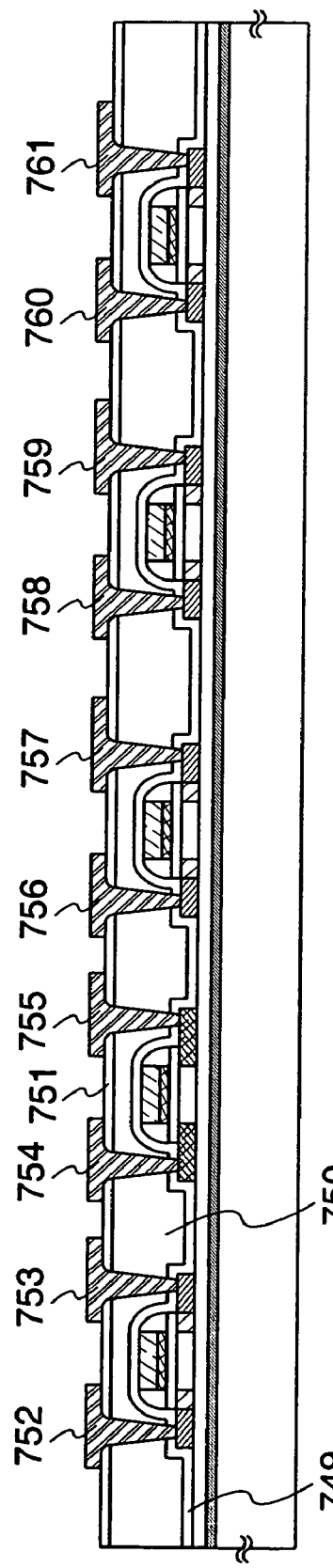
FIGS. 10A and 10B are diagrams showing an example of a method for manufacturing the semiconductor device of the present invention.

Subsequently, a single layer or laminated layer of an insulating film is formed to cover the thin film transistors 744 to 748 (FIG. 10A). The insulating film covering the thin film transistors 744 to 748 is formed by an SOG method, a droplet discharge method, or the like with a single layer or a laminated layer of an inorganic material such as oxide of silicon and/or nitride of silicon, an organic material such as polyimide, polyamide, benzocyclobutene, acrylic, epoxy, or siloxane, or the like. A siloxane-based material corresponds to a material of which skeleton is formed with a bond of silicon and oxygen and which includes at least hydrogen as a substituent, or a material of which skeleton is formed with a bond of silicon and oxygen and which includes at least one of fluorine, an alkyl group, and aromatic hydrocarbon as a substituent. For example, in the case where the insulating film covering the thin film transistors 744 to 748 has a three-layer structure, a film containing silicon oxide may be formed as a first insulating film 749, a film containing a resin may be formed as a second insulating film 750, and a film containing silicon nitride may be formed as a third insulating film 751.

Note that heat treatment for recovering crystallinity of the semiconductor films, activating the impurity elements added to the semiconductor films, or hydrogenating the semiconductor films, is preferably performed before forming the insulating films 749 to 751 or after forming one or a plurality of the insulating films 749 to 751. The heat treatment is preferably performed by applying a thermal annealing method, a laser annealing method, an RTA method, or the like.

Next, the insulating films 749 to 751 are etched by a photolithography method to form contact holes which expose the second N-type impurity regions 726 and 728 to 732 and the P-type impurity region 712. Subsequently, a conductive film is formed to fill the contact holes. The conductive film is patterned to form conductive films 752 to 761 functioning as source and drain wires.

The conductive films 752 to 761 are formed by a CVD method, a sputtering method, or the like with a single layer or a laminated layer of an element selected from aluminum (Al), tungsten (W), titanium (Ti), tantalum (Ta), molybdenum (Mo), nickel (Ni), platinum (Pt), copper (Cu), gold (Au), silver (Ag), manganese (Mn), neodymium (Nd), carbon (C), and silicon (Si) or an alloy material or a compound material containing the element as its main component. The alloy material containing aluminum as its main component corresponds to, for example, a material containing aluminum as its component and nickel or an alloy material containing aluminum as its main component, nickel, and either or both carbon and silicon. The conductive films 752 to 761 may have, for example, a laminated structure of a barrier film, an aluminum silicon (Al—Si) film, and a barrier film or a laminated structure of a barrier film, an aluminum silicon (Al—Si) film, a titanium nitride (TiN) film, and a barrier film. Note that the barrier film corresponds to a thin film of titanium, nitride of titanium, molybdenum, or nitride of molybdenum. Aluminum and aluminum silicon have low resistance and are inexpensive, which are optimum for a material of the conductive films 752 to 761. When upper and lower barrier layers are provided, generation of a hillock of aluminum or aluminum silicon can be prevented. By forming the barrier film of titanium that is an element having a high reducing property, even when a thin natural oxide film is formed on the crystalline semiconductor film, the natural oxide film can be reduced, so that favorable contact with the crystalline semiconductor film can be formed.

Figure 10B:
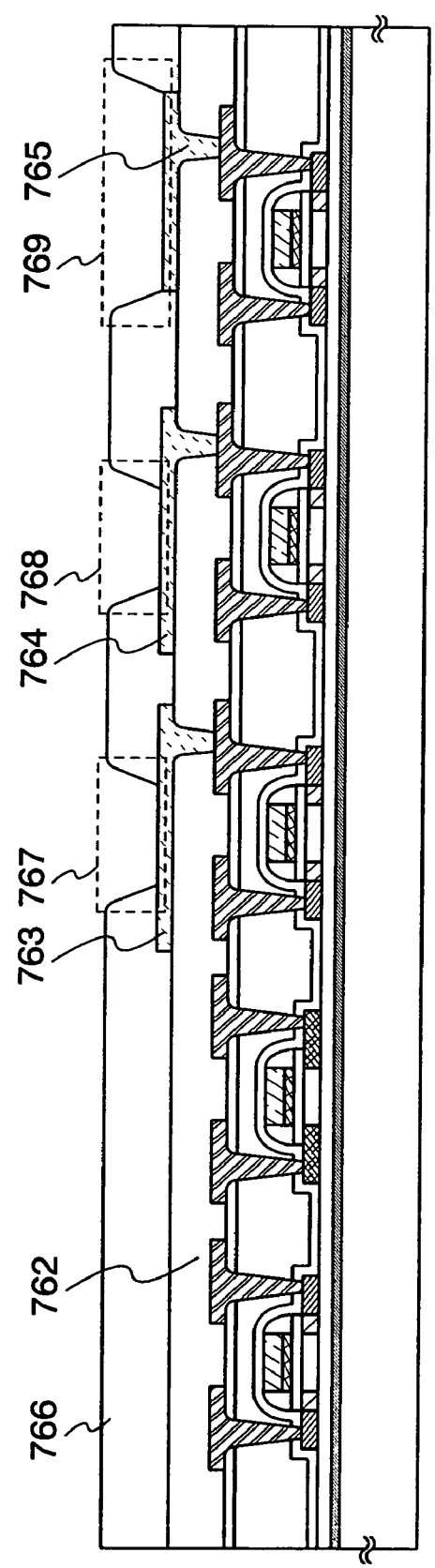

Next, an insulating film 762 is formed to cover the conductive films 752 to 761 (FIG. 10B). The insulating film 762 is formed with a single layer or a laminated layer of an inorganic material or an organic material by an SOG method, a droplet discharge method, or a printing method such as a screen printing method or a gravure printing method. In addition, the insulating film 762 is preferably formed with a thickness of 0.75 μm to 3 μm.

Subsequently, the insulating film 762 is etched by a photolithography method to form contact holes which expose the conductive films 757, 759, and 761. Then, a conductive film is formed to fill the contact holes. The conductive film is formed of a conductive material using a plasma CVD method, a sputtering method, or the like. Next, the conductive film is patterned to form conductive films 763 to 765. Note that each of the conductive films 763 and 764 serves as one of a pair of conductive films included in a storage element. Consequently, the conductive films 763 to 765 are preferably formed with a single layer or a laminated layer of titanium or an alloy material or a compound material containing titanium as its main component. Titanium has low resistance, which leads to a reduction in size of a storage element and achievement of higher integration. In a photolithography step to form the conductive films 763 to 765, wet etching processing is preferably performed so as not to damage the thin film transistors 744 to 748 therebelow, and hydrogen fluoride (HF) or ammonia peroxide is preferably used as an etchant.

Next, an insulating film 766 is formed to cover the conductive films 763 to 765. The insulating film 766 is formed with a single layer or a laminated layer of an inorganic material or an organic material by an SOG method, a droplet discharge method, or the like. The insulating film 762 is preferably formed with a thickness of 0.75 μm to 3 μm. Subsequently, the insulating film 766 is etched by a photolithography method to form contact holes 767 to 769 which expose the conductive films 763 to 765.

Next, a conductive film 786 functioning as an antenna is formed in contact with the conductive film 765 (FIG. 11A). The conductive film 786 is formed of a conductive material by a CVD method, a sputtering method, a printing method, a droplet discharge method, or the like. Preferably, the conductive film 786 is formed with a single layer or a laminated layer of an element selected from aluminum (Al), titanium (Ti), silver (Ag), copper (Cu), and gold (Au) or an alloy material or a compound material containing the element as its main component. Specifically, the conductive film 786 is formed by using paste containing silver by a screen printing method and then performing heat treatment at a temperature of 50° C. to 350° C. Alternatively, the conductive film 786 is formed by forming an aluminum film by a sputtering method and patterning the aluminum film. The aluminum film may be patterned by wet etching processing, and after the wet etching processing, heat treatment may be performed at a temperature of 200° C. to 300° C.

Next, an organic compound layer 787 functioning as a storage element is formed to be in contact with the conductive films 763 and 764 (FIG. 11B). A material of which property or state changes by an electrical effect, an optical effect, a thermal effect, or the like is used as a material for the storage element. For example, a material, of which property or state changes by melting due to Joule heat, dielectric breakdown, or the like to cause an upper electrode and a lower electrode to short, may be used. Therefore, a thickness of a layer used for the storage element (here, the organic compound layer) is preferably 5 nm to 100 nm, more preferably, 10 nm to 60 nm.

Here, the organic compound layer 787 is formed by a droplet discharge method, a spin coating method, a vapor deposition method, or the like. Subsequently, a conductive film 771 is formed to be in contact with the organic compound layer 787. The conductive film 771 is formed by a sputtering method, a spin coating method, a droplet discharge method, a vapor deposition method, or the like.

Through the above-mentioned steps, a storage element portion 789 including a lamination body of the conductive film 763, the organic compound layer 787, and the conductive film 771 and a storage element portion 790 including a lamination body of the conductive film 764, the organic compound layer 787, and the conductive film 771 are formed.

Note that a feature of the above manufacturing steps is to perform the step of forming the organic compound layer 787 after the step of forming the conductive film 786 functioning as the antenna since heat resistance of the organic compound layer 787 is not high.

As an organic material used for the organic compound layer, for example, an aromatic amine-based compound (that is, a compound having a benzene ring-nitrogen bond) such as 4,4'-bis[N-(1-naphthyl)-N-phenyl-animo]-biphenyl (abbr.: α-NPD), 4,4'-bis[N-(3-methylphenyl)-N-phenyl-amino]-biphenyl (abbr.: TPD), 4,4',4"-tris(N,N-diphenyl-amino)-triphenylamine (abbr.: TDATA), 4,4',4"-tris[N-(3-methylphenyl)-N-phenyl-amino]-triphenylamine (abbr.: MTDATA), and 4,4'-bis{N-[4-(N,N-di-m-tolylamino)phenyl]-N-phenylamino}biphenyl (abbr.: DNTPD), polyvinyl carbazole (abbr.: PVK), a phthalocyanine compound such as phthalocyanine (abbr.: $H_2Pc$), copper phthalocyanine (abbr.: CuPc), or vanadyl phthalocyanine (abbr.: VOPc), or the like can be used. These materials have a high hole transporting property.

Besides, a material formed of a metal complex or the like having a quinoline skeleton or a benzoquinoline skeleton such as tris(8-quinolinolato)aluminum (abbr.: $Alq_3$), tris(4-methyl-8-quinolinolato)aluminum (abbr.: $Almq_3$), bis(10-hydroxybenzo[h]-quinolinato)beryllium (abbr.: $BeBq_2$), or bis(2-methyl-8-quinolinolato)-4-phenylphenolato-aluminum (abbr.: BAlq), a material formed of a metal complex or the like having an oxazole-based or thiazole-based ligand such as bis[2-(2-hydroxyphenyl)benzoxazolato]zinc (abbr.: $Zn(BOX)_2$), or bis[2-(2-hydroxyphenyl)benzothiazolato] zinc (abbr.: $Zn(BTZ)_2$), or the like can be used. These materials have a high electron transporting property.

Other than the metal complexes, a compound or the like such as 2-(4-biphenylyl)-5-(4-tert-butylphenyl)-1,3,4-oxadiazole (abbr.: PBD), 1,3-bis[5-(p-tert-butylphenyl)-1,3,4-oxadiazol-2-yl]benzene (abbr.: OXD-7), 3-(4-tert-butylphenyl)-4-phenyl-5-(4-biphenylyl)-1,2,4-triazole (abbr.: TAZ), 3-(4-tert-butylphenyl)-4-(4-ethylphenyl)-5-(4-biphenylyl)-1,2,4-triazole (abbr.: p-EtTAZ), bathophenanthroline (abbr.: BPhen), bathocuproin (abbr.: BCP), or the like can be used.

The organic compound layer may have a single-layer structure or a laminated structure. In the case of a laminated structure, materials can be selected from the aforementioned materials to form a laminated structure. Further, the aforementioned organic material and a light emitting material may be laminated. As the light emitting material, 4-dicyanomethylene-2-methyl-6-[2-(1,1,7,7-tetramethyljulolidine-9-yl)ethenyl]-4H-pyran (abbr.: DCJT), 4-dicyanomethylene-2-t-butyl-6-[2-(1,1,7,7-tetramethyljulolidine-9-yl)ethenyl]-4H-pyran, periflanthene, 2,5-dicyano-1,4-bis[(10-methoxy-1,1,7,7-tetramethyljulolidine-9-yl)ethenyl]benzene, N,N'-dimethylquinacridone (abbr.: DMQd), coumarin 6, coumarin 545T, tris(8-quinolinolato)aluminum (abbr.: $Alq_3$), 9,9'-bianthlyl, 9,10-diphenylanthracene (abbr.: DPA), 9,10-bis(2-naphthyl)anthracene (abbr.: DNA), 2,5,8,11-tetra-t-buthylperylene (abbr.: TBP), or the like can be used.

A layer in which the above light emitting material is dispersed may be used. In the layer in which the above light emitting material is dispersed, an anthracene derivative such as 9,10-di(2-naphthyl)-2-tert-butylanthracene (abbr.: t-BuDNA), a carbazole derivative such as 4,4'-di(N-carbazolyl)biphenyl (abbr.: CBP), a metal complex such as bis[2-(2-hydroxyphenyl)pyridinato]zinc (abbr.: $Znpp_2$) or bis[2-(2-hydroxyphenyl)benzoxazolato]zinc (abbr.: ZnBOX), or the like can be used as a base material. In addition, tris(8-quinolinolato)aluminum (abbr.: $Alq_3$), 9,10-bis(2-naphthyl)anthracene (abbr.: DNA), bis(2-methyl-8-quinolinolato)-4-phenylphenolato-aluminum (abbr.: BAlq), or the like can be used.

Such an organic material is changed its property by a thermal effect or the like; therefore, a glass transition temperature (Tg) thereof is preferably 50° C. to 300° C., more preferably, 80° C. to 120° C.

In addition, a material in which metal oxide is mixed with an organic material or a light emitting material may be used. Note that the material in which metal oxide is mixed includes a state in which metal oxide is mixed or laminated with the above organic material or the above light emitting material. Specifically, it indicates a state which is formed by a coevaporation method using plural evaporation sources. Such a material can be referred to as an organic-inorganic composite material.

For example, in the case of mixing a substance having a high hole transporting property with metal oxide, it is preferable to use vanadium oxide, molybdenum oxide, niobium oxide, rhenium oxide, tungsten oxide, ruthenium oxide, titanium oxide, chromium oxide, zirconium oxide, hafnium oxide, or tantalum oxide as the metal oxide.

In the case of mixing a substance having a high electron transporting property with metal oxide, it is preferable to use lithium oxide, calcium oxide, sodium oxide, potassium oxide, or magnesium oxide as the metal oxide.

A material of which property changes by an electrical effect, an optical effect, or a thermal effect may be used for the organic compound layer; therefore, for example, a conjugated high molecular compound doped with a compound (photoacid generator) which generates acid by absorbing light can also be used. As the conjugated high molecular compound, polyacetylenes, polyphenylene vinylenes, polythiophenes, polyanilines, polyphenylene ethinylenes, or the like can be used. As the photoacid generator, aryl sulfonium salt, aryl iodonium salt, o-nitrobenzyl tosylate, aryl sulfonic acid p-nitrobenzyl ester, sulfonyl acetophenones, Fe-arene complex PF6 salt, or the like can be used.

Note that the example of using an organic compound material for the storage element portions 789 and 790 is described here, but the invention is not limited thereto. For example, a phase change material such as a material which changes reversibly between a crystalline state and an amorphous state or a material which changes reversibly between a first crystalline state and a second crystalline state can be used. Further, a material which changes only from an amorphous state to a crystalline state can be used.

The material which reversibly changes between a crystalline state and an amorphous state is a material containing a plurality of elements selected from germanium (Ge), tellurium (Te), antimony (Sb), sulphur (S), tellurium oxide (TeOx), tin (Sn), gold (Au), gallium (Ga), selenium (Se), indium (In), thallium (Tl), cobalt (Co), and silver (Ag). For example, a material based on Ge—Te—Sb—S, Te—TeO$_2$—Ge—Sn, Te—Ge—Sn—Au, Ge—Te—Sn, Sn—Se—Te, Sb—Se—Te, Sb—Se, Ga—Se—Te, Ga—Se—Te—Ge, In—Se, In—Se—Tl—Co, Ge—Sb—Te, In—Se—Te, or Ag—In—Sb—Te may be used. The material which reversibly changes between the first crystalline state and the second crystalline state is a material containing a plurality of elements selected from silver (Ag), zinc (Zn), copper (Cu), aluminum (Al), nickel (Ni), indium (In), antimony (Sb), selenium (Se), and tellurium (Te), for example, Te—TeO$_2$, Te—TeO$_2$—Pd, or Sb$_2$Se$_3$/Bi$_2$Te$_3$. When using this material, a phase change is carried out between two different crystalline states. The material which changes only from an amorphous state to a crystalline state is a material containing a plurality of elements selected from tellurium (Te), tellurium oxide (TeO$_X$), antimony (Sb), selenium (Se), and bismuth (Bi), for example, Ag—Zn, Cu—Al—Ni, In—Sb, In—Sb—Se, or In—Sb—Te.

Next, an insulating film 772 functioning as a protective film is formed by an SOG method, a spin coating method, a droplet discharge method, a printing method, or the like to cover the storage element portions 789 and 790 and the conductive film 786 functioning as the antenna. The insulating film 772 is formed of a film containing carbon such as DLC (Diamond Like Carbon), a film containing silicon nitride, a film containing silicon nitride oxide, or an organic material, preferably, an epoxy resin.

Then, the substrate 701 is thinned or removed as described in the above embodiment modes (FIG. 12A). Here, an example of removing the substrate 701 by performing grinding treatment, polishing treatment, etching by chemical treatment, or the like on the substrate 701 to expose the insulating film 702 as shown in FIGS. 4A to 4C is described. Here, the substrate 701 is thinned using a grinding means 795. Note that polishing treatment, etching using chemical treatment, or the like may be performed after thinning the substrate 701 by the grinding means 795. Thus, in the case of performing grinding treatment, polishing treatment, etching by chemical treatment, or the like on the substrate 701 until the insulating film 702 is exposed, the insulating film 702 can be used as a stopper.

Alternatively, after thinning the substrate 701 so that a part thereof remains, an insulating film functioning as a protective film may be formed by performing surface treatment on the remaining substrate 701 as shown in FIG. 6B, or an insulating film functioning as a protective film can be formed as shown in FIGS. 5A to 5D by performing surface treatment after thinning the substrate 701 without forming the insulating film 702.

Next, sealing treatment is performed using a first sheet material 791 and a second sheet material 792 (FIG. 12B).

The first sheet material 791 and the second sheet material 792 used for sealing may be a film made of polypropylene, polyester, vinyl, polyvinyl fluoride, polyvinyl chloride, or the like, paper of a fibrous material, or a laminated film of a base film (polyester, polyamide, an inorganic vapor-deposited film, paper, or the like) and an adhesive synthetic resin film (an acrylic-based synthetic resin, an epoxy-based synthetic resin, or the like). The film may be subjected to heat treatment and pressure treatment with an object to be treated. In performing heat treatment and pressure treatment, an adhesive layer provided on the uppermost surface of the film or a layer (not an adhesive layer) provided on the outermost layer is melted by heat treatment to be attached by applying pressure. An adhesive layer may be provided on the surface of the first sheet material 791 and the second sheet material 792, but it is not necessarily provided. The adhesive layer corresponds to a layer containing an adhesive such as a thermosetting resin, a UV curing resin, an epoxy-based resin, or a resin additive. The sheet material used for sealing is preferably coated with silica to prevent moisture or the like from entering the inside after sealing, and for example, a sheet material in which an adhesive layer, a film of polyester or the like, and silica coat are laminated can be used.

As the first sheet material 791 and the second sheet material 792, a film subjected to antistatic treatment for preventing static electricity or the like (hereinafter referred to as an antistatic film) may be used as well. An antistatic film includes a film where an antistatic material is dispersed in a resin, a film to which an antistatic material is attached, and the like. A film containing an antistatic material may be a film having one surface provided with an antistatic material, or a film having the both surfaces provided with an antistatic material. In a film having one surface provided with an antistatic material, a surface containing an antistatic material may be attached to the inside or outside of the film. Note that an antistatic material may be provided over the entire surface or a part of a film. An antistatic material herein includes metal, oxide of indium and tin (ITO), and a surfactant such as a zwitterionic surfactant, a cationic surfactant, and a nonionic surfactant. Instead, a resin material containing a cross-linked copolymer high molecular compound having a carboxyl group and a quaternary ammonium base in a side chain may be used as an antistatic material. An antistatic film may be obtained by attaching, kneading, or applying these materials to a film. When a semiconductor device is sealed with an antistatic film, the semiconductor element can be protected from external static electricity or the like when being handled as a product.

Note that in the case of not particularly requiring sealing treatment, a semiconductor device can be completed with the structure shown in FIG. 12A. In the sealing treatment, sealing of either the substrate 701 or the insulating film 772 may be performed selectively.

Note that this embodiment mode can be freely combined with the above embodiment mode. In other words, the material or the formation method described in the above embodiment mode can be used in combination also in this embodiment mode, and the material or the formation method described in this embodiment mode can be used in combination also in the above embodiment mode.

Embodiment Mode 4

Figure 13B:
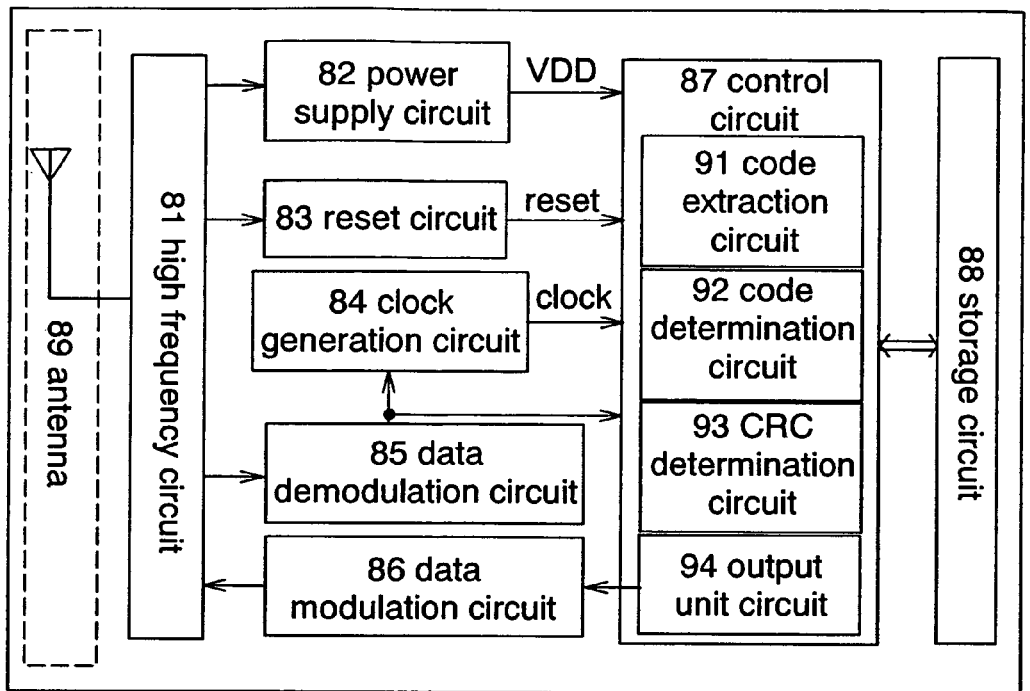
FIGS. 13B and 13C are diagrams showing examples of types of usage of a semiconductor device of the present invention.
Figure 13B:
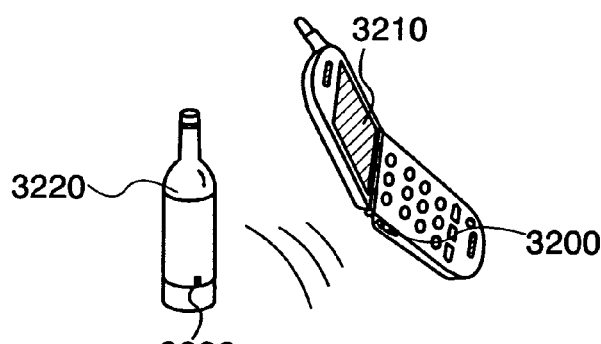
Figure 13C:
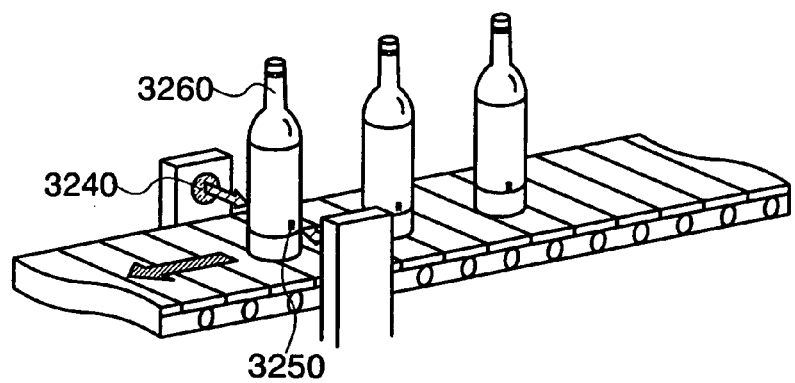

In this embodiment mode, applications of a semiconductor device which can exchange data without contact are explained with reference to FIGS. 13A to 13C. The semiconductor device which can exchange data without contact is also referred to as an RFID (Radio Frequency Identification) tag, an ID tag, an IC tag, an IC chip, an RF (Radio Frequency) tag, a wireless tag, an electronic tag, or a wireless chip depending on application modes.

A semiconductor device 80 has the function of communicating data without contact, and includes a high frequency circuit 81, a power supply circuit 82, a reset circuit 83, a clock generation circuit 84, a data demodulation circuit 85, a data modulation circuit 86, a control circuit 87 for controlling other circuits, a storage circuit 88, and an antenna 89 (FIG. 13A). The high frequency circuit 81 is a circuit which receives a signal from the antenna 89 and outputs a signal received by the data modulation circuit 86 from the antenna 89. The power supply circuit 82 is a circuit which generates a power supply potential from the received signal. The reset circuit 83 is a circuit which generates a reset signal. The clock generation circuit 84 is a circuit which generates various clock signals based on the received signal input from the antenna 89. The data demodulation circuit 85 is a circuit which demodulates the received signal and outputs the signal to the control circuit 87. The data modulation circuit 86 is a circuit which modulates a signal received from the control circuit 87. As the control circuit 87, a code extraction circuit 91, a code determination circuit 92, a CRC determination circuit 93, and an output unit circuit 94 are provided for example. Note that the code extraction circuit 91 is a circuit which separately extracts a plurality of codes included in an instruction transmitted to the control circuit 87. The code determination circuit 92 is a circuit which compares the extracted code and a code corresponding to a reference to determine the content of the instruction. The CRC circuit is a circuit which detects the presence or absence of a transmission error or the like based on the determined code.

In addition, the number of storage circuits to be provided is not limited to one, and may be plural. An SRAM, a flash memory, a ROM, an FeRAM, or the like, or a circuit using the organic compound layer described in the above embodiment mode in a storage element portion can be used.

Next, an example of operation of a semiconductor device which can communicate data without contact of the present invention is explained. First, a radio signal is received by the antenna 89. The radio signal is transmitted to the power supply circuit 82 via the high frequency circuit 81, and a high power supply potential (hereinafter referred to as VDD) is generated. The VDD is supplied to each circuit included in the semiconductor device 80. In addition, a signal transmitted to the data demodulation circuit 85 via the high frequency circuit 81 is demodulated (hereinafter, a demodulated signal). Further, a signal transmitted through the reset circuit 83 and the clock generation circuit 84 via the high frequency circuit 81 and the demodulated circuit 85 are transmitted to the control circuit 87. The signal transmitted to the control circuit 87 is analyzed by the code extraction circuit 91, the code determination circuit 92, the CRC assessment circuit 93, and the like. Then, in accordance with the analyzed signal, information of the semiconductor device stored in the storage circuit 88 is output. The output information of the semiconductor device is encoded through the output unit circuit 94. Furthermore, the encoded information of the semiconductor device 80 is transmitted by the antenna 89 as a radio signal through the data modulation circuit 86. Note that a low power supply potential (hereinafter, VSS) is common among a plurality of circuits included in the semiconductor device 80, and VSS can be set to GND.

Thus, data of the semiconductor device can be read by transmitting a signal from a reader/writer to the semiconductor device 80 and receiving the signal transmitted from the semiconductor device 80 by the reader/writer.

In addition, the semiconductor device 80 may supply a power supply voltage to each circuit by an electromagnetic wave without a power source (battery) mounted, or by an electromagnetic wave and a power source (battery) with the power source (battery) mounted.

Since a semiconductor device which can be bent can be manufactured by using the structure described in the above embodiment modes, the semiconductor device can be provided over an object having a curved surface by attachment.

Subsequently, an example of an application of a semiconductor device which can exchange data without contact is explained. A side face of a portable terminal including a display portion 3210 is provided with a reader/writer 3200, and a side face of an article 3220 is provided with a semiconductor device 3230 (FIG. 13B). When the reader/writer 3200 is held over the semiconductor device 3230 included in the article 3220, information on the article 3220 such as a raw material, the place of origin, an inspection result in each production process, the history of distribution, or an explanation of the article is displayed on the display portion 3210. Further, when a product 3260 is transported by a conveyor belt, the product 3260 can be inspected using a reader/writer 3240 and a semiconductor device 3250 provided over the product 3260 (FIG. 13C). Thus, by utilizing the semiconductor device for a system, information can be acquired easily, and improvement in functionality and added value of the system can be achieved. As described in the above embodiment modes, a transistor or the like included in a semiconductor device can be prevented from being damaged even when the semiconductor device is attached to an object having a curved surface, and a reliable semiconductor device can be provided.

In addition, as a signal transmission method in the above-described semiconductor device which can exchange data without contact, an electromagnetic coupling method, an electromagnetic induction method, a microwave method, or the like can be used. The transmission system may be appropriately selected by a practitioner in consideration of an intended use, and an optimum antenna may be provided in accordance with the transmission method.

In the case of employing, for example, an electromagnetic coupling method or an electromagnetic induction method (for example, a 13.56 MHz band) as the signal transmission method in the semiconductor device, electromagnetic induction caused by a change in magnetic field density. Therefore, the conductive film serving as the antenna is formed in an annular shape (for example, a loop antenna) or a spiral shape (for example, a spiral antenna).

In the case of employing, for example, a microwave method (for example, a UHF band (860 to 960 MHz band), a 2.45 GHz band, or the like) as the signal transmission method in the semiconductor device, the shape such as a length of the conductive film serving as the antenna may be appropriately set in consideration of a wavelength of an electromagnetic wave used for signal transmission. For example, the conductive film serving the an antenna can be formed in a linear shape (for example, a dipole antenna), a flat shape (for example, a patch antenna), or the like. The shape of the conductive film serving as the antenna is not limited to a linear shape, and the conductive film serving as the antenna may be provided in a curved-line shape, a meander shape, or a combination thereof, in consideration of a wavelength of an electromagnetic wave.

The conductive film functioning as the antenna is formed of a conductive material by a CVD method, a sputtering method, a printing method such as screen printing or gravure printing, a droplet discharge method, a dispenser method, a plating method, or the like. The conductive film is formed with a single-layer structure or a laminated structure of an element selected from aluminum (Al), titanium (Ti), silver (Ag), copper (Cu), gold (Au), platinum (Pt), nickel (Ni), palladium (Pd), tantalum (Ta), and molybdenum (Mo) or an alloy material or a compound material containing the element as its main component.

In the case of forming a conductive film functioning as an antenna by using, for example, a screen printing method, the conductive film can be provided by selectively printing conductive paste in which conductive particles each having a grain size of several nm to several tens of µm are dissolved or dispersed in an organic resin. As the conductive particle, a fine particle or a dispersive nanoparticle of metal of one or more of silver (Ag), gold (Au), copper (Cu), nickel (Ni), platinum (Pt), palladium (Pd), tantalum (Ta), molybdenum (Mo), and titanium (Ti) or silver halide can be used. In addition, as the organic resin included in the conductive paste, one or a plurality of organic resins each functioning as a binder, a solvent, a dispersant, or a coating of the metal particle can be used. Typically, an organic resin such as an epoxy resin or a silicon resin can be used. When forming a conductive film, baking is preferably performed after the conductive paste is applied. For example, in the case of using fine particles (of which grain size is 1 nm to 100 nm) containing silver as its main component as a material of the conductive paste, a conductive film can be obtained by curing the conductive paste by baking at a temperature of 150° C. to 300° C. Alternatively, fine particles containing solder or lead-free solder as its main component may be used; in this case, it is preferable to use a fine particle having a grain size of 20 µm. Solder or lead-free solder has an advantage such as low cost.

Besides the above-mentioned material, ceramic, ferrite, or the like may be applied to an antenna. Furthermore, a material of which dielectric constant and magnetic permeability are negative in a microwave band (metamaterial) can be applied to an antenna.

In the case of applying an electromagnetic coupling method or an electromagnetic induction method, and providing a semiconductor device including an antenna in contact with metal, a magnetic material having magnetic permeability is preferably provided between the semiconductor device and metal. In the case of providing a semiconductor device including an antenna in contact with metal, an eddy current flows in metal accompanying change in magnetic field, and a demagnetizing field generated by the eddy current impairs a change in magnetic field and decreases a communication distance. Therefore, eddy current of metal and a decrease in communication range can be suppressed by providing a material having magnetic permeability between the semiconductor device and metal. Note that ferrite or a metal thin film having high magnetic permeability and little loss of high frequency wave can be used as the magnetic material.

In the case of providing an antenna, a semiconductor element such as a transistor and a conductive film functioning as an antenna may be directly formed over one substrate, or a semiconductor element and a conductive film functioning as an antenna may be provided over separate substrates and then attached to be electrically connected to each other.

Note that an applicable range of the flexible semiconductor device is wide in addition to the above, and the flexible semiconductor device can be applied to any product as long as it clarifies information such as the history of an object without contact and is useful for production, management, or the like. For example, the semiconductor device can be mounted on paper money, coins, securities, certificates, bearer bonds, packing containers, books, recording media, personal belongings, vehicles, food, clothing, health products, commodities, medicine, electronic devices, and the like. Examples of them are explained with reference to FIGS. 14A to 14H.

Figure 14A:
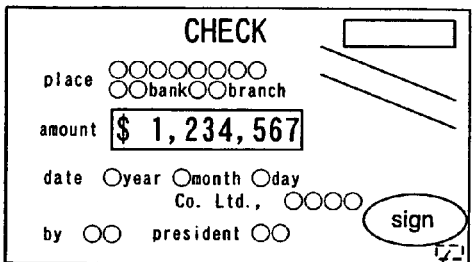
FIGS. 14A to 14H are diagrams showing examples of types of usage of a semiconductor device of the present invention.
Figure 14B:
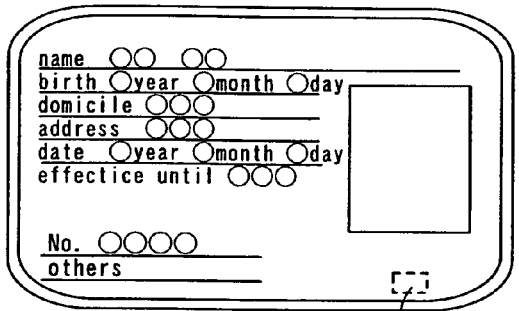
Figure 14C:
Figure 14D:
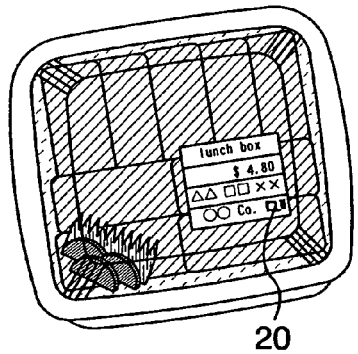
Figure 14E:
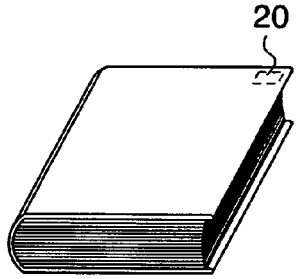
Figure 14F:
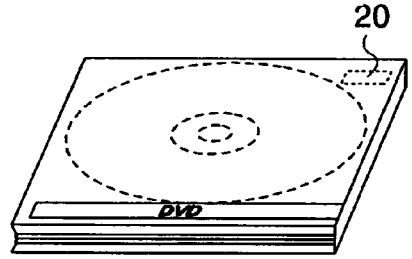
Figure 14G:
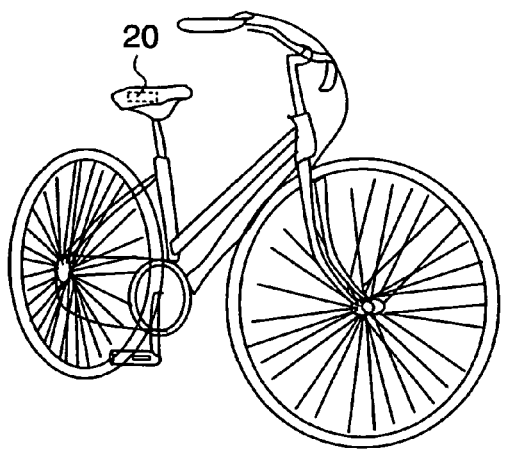
Figure 14H:
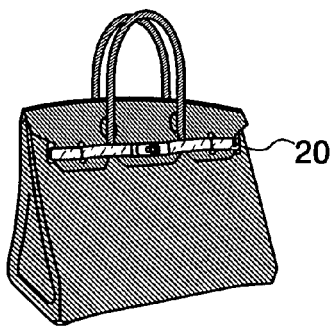

The paper money and coins are money distributed to the market and include one valid in a certain area (cash voucher), memorial coins, and the like. The securities refer to checks, certificates, promissory notes, and the like (FIG. 14A). The certificates refer to driver's licenses, certificates of residence, and the like (FIG. 14B). The bearer bonds refer to stamps, rice coupons, various gift certificates, and the like (FIG. 14C). The packing containers refer to wrapping paper for food containers and the like, plastic bottles, and the like (FIG. 14D). The books refer to hardbacks, paperbacks, and the like (FIG. 14E). The recording media refer to DVD software, video tapes, and the like (FIG. 14F). The vehicles refer to wheeled vehicles such as bicycles, ships, and the like (FIG. 14G). The personal belongings refer to bags, glasses, and the like (FIG. 14H). The food refers to food articles, drink, and the like. The clothing refers to clothes, footwear, and the like. The health products refer to medical instruments, health instruments, and the like. The commodities refer to furniture, lighting equipment, and the like. The medicine refers to medical products, pesticides, and the like. The electronic devices refer to liquid crystal display devices, EL display devices, television devices (TV sets and flat-screen TV sets), cellular phones, and the like.

Forgery can be prevented by providing the paper money, the coins, the securities, the certificates, the bearer bonds, or the like with the semiconductor device. The efficiency of an inspection system, a system used in a rental shop, or the like can be improved by providing the packing containers, the books, the recording media, the personal belongings, the food, the commodities, the electronic devices, or the like with the semiconductor device. Forgery or theft can be prevented by providing the vehicles, the health products, the medicine, or the like with the semiconductor device; further, in the case of the medicine, medicine can be prevented from being taken mistakenly. The semiconductor device can be mounted on the foregoing article by being attached to the surface or being embedded therein. For example, in the case of a book, the semiconductor device may be embedded in a piece of paper; in the case of a package made from an organic resin, the semiconductor device may be embedded in the organic resin. By using a flexible semiconductor device having the structure described in the above embodiment mode, breakage or the like of an element included in the semiconductor device can be prevented even when the semiconductor device is mounted on paper or the like.

As described above, the efficiency of an inspection system, a system used in a rental shop, or the like can be improved by providing the packing containers, the recording media, the personal belonging, the food, the clothing, the commodities, the electronic devices, or the like with the semiconductor device. In addition, by providing the vehicles with the semiconductor device, forgery or theft can be prevented. Further, by implanting the semiconductor device in a creature such as an animal, an individual creature can be easily identified. For example, by implanting the semiconductor device with a sensor in a creature such as livestock, its health condition such as a current body temperature as well as its birth year, sex, breed, or the like can be easily managed.

Note that this embodiment mode can be freely combined with the above embodiment mode. In other words, the material or the formation method described in the above embodiment mode can be used in combination also in this embodiment mode, and the material or the formation method described in this embodiment mode can be used in combination also in the above embodiment mode.

Embodiment Mode 5

In this embodiment mode, a structure of a semiconductor device of the present invention, which is different from those in the above embodiment modes, is explained with reference to drawings. Specifically, an example of a semiconductor device having a pixel portion is explained.

First, the case of providing a light emitting element in a pixel portion is explained with reference to FIGS. 15A and 15B. Note that FIG. 15A is a top view showing an example of a semiconductor device of the present invention, and FIG. 15B is a cross-sectional view of FIG. 15A taken along lines a-b and c-d.

Figure 15A:
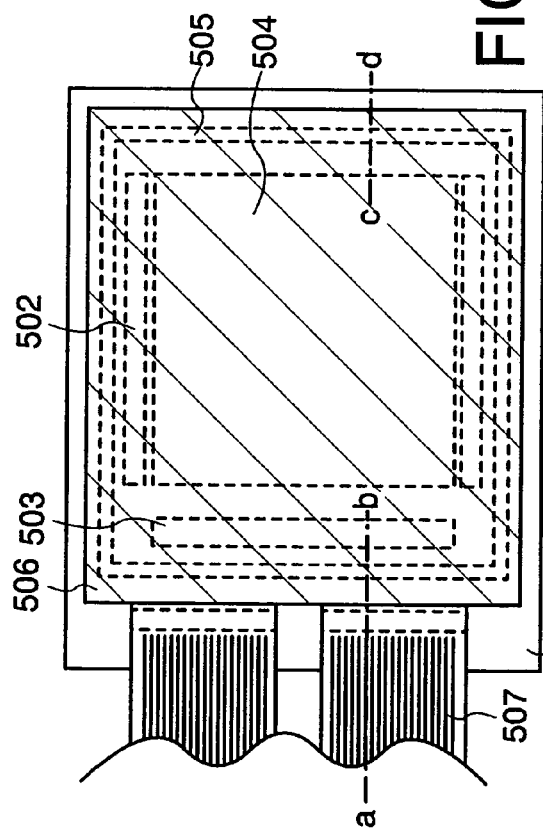
FIGS. 15A and 15B are diagrams showing an example of a semiconductor device of the present invention.

As shown in FIG. 15A, a semiconductor device described in this embodiment mode includes a scan line driver circuit 502, a signal line driver circuit 503, and a pixel portion 504 which are provided over a substrate 501. In addition, an opposite substrate 506 is provided to sandwich the pixel portion 504 with the substrate 501. The scan line driver circuit 502, the signal line driver circuit 503, and the pixel portion 504 can be provided by forming thin film transistors each having any of the structures described in the above embodiment mode. The substrate 501 and the opposite substrate 506 are attached to each other with a sealant 505. The scan line driver circuit 502 and the signal line driver circuit 503 receive a video signal, a clock signal, a start signal, a reset signal, or the like from an FPC (Flexible Printed Circuit) 507 serving as an external input terminal. Note that only the FPC is shown here; however, the FPC may be provided with a printed wiring board (PWB).

Figure 15B:
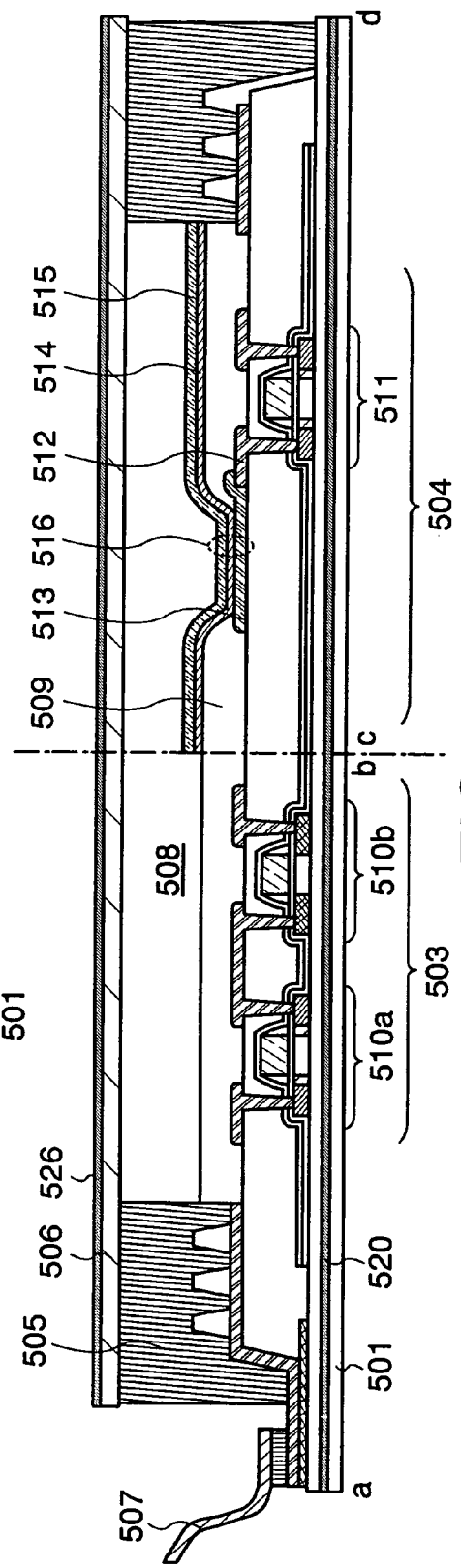

FIG. 15B is a cross-sectional view of FIG. 15A taken along lines a-b and c-d. Here, thin film transistors included in the signal line driver circuit 503 and the pixel portion 504 are provided over the substrate 501 with an insulating film 520 functioning as a protective film interposed therebetween. A CMOS circuit that is a combination of an N-type thin film transistor 510a and a P-type thin film transistor 510b having any of the structure described in the above embodiment mode is formed as the signal line driver circuit 503. The driver circuit such as the scan line driver circuit 502 or the signal line driver circuit 503 may be formed using a CMOS circuit, a PMOS circuit, or an NMOS circuit. A driver integration type in which a driver circuit such as the scan line deriver circuit 502 and the signal line driver circuit 503 are formed over the substrate 501 is described in this embodiment mode, but it is not necessarily required and a driver circuit can be formed outside the substrate 501. In addition, an insulating film 526 functioning as a protective film is provided on the surface of the opposite substrate 506. Note that the substrate 501 may have any of the structures described in the above embodiment modes. Here, after forming the insulating film 520 functioning as a protective film by performing surface treatment on one side of the substrate, a semiconductor element is provided over the insulating film 520, and the substrate is thinned from the other side, thereby obtaining the substrate 501. Further, the opposite substrate 506 is provided with an insulating film 526 functioning as a protective film by performing surface treatment after thinning the substrate.

The pixel portion 504 is formed with a plurality of pixels each including a light emitting element 516 and a thin film transistor 511 for driving the light emitting element 516. A thin film transistor having any of the structures described in the above embodiment modes can be applied to the thin film transistor 511. Here, a first electrode 513 is provided so as to be connected to a conductive film 512 connected to a source or drain region of the thin film transistor 511, and an insulating film 509 is formed to cover an end portion of the first electrode 513. The insulating film 509 functions as a partition in a plurality of pixels.

As the insulating film 509, a positive type photosensitive acrylic resin film is used here. The insulating film 509 is formed to have a curved surface at an upper end portion or a lower end portion thereof in order to make the coverage favorable. For example, in the case of using positive type photosensitive acrylic as a material of the insulating film 509, the insulating film 509 is preferably formed to have a curved surface with a curvature radius (0.2 µm to 3 µm) only at an upper end portion. Either a negative type which becomes insoluble in an etchant by light irradiation or a positive type which becomes soluble in an etchant by light irradiation can be used as the insulating film 509. Alternatively, the insulating film 509 can be provided with a single layer or a laminated structure of an organic material such as epoxy, polyimide, polyamide, polyvinylphenol, or benzocyclobutene or a siloxane resin. As described in the above embodiment mode, the surface of the insulating film 509 can be modified to obtain a dense film by performing plasma treatment on the insulating film 509 and oxidizing or nitriding the insulating film 509. By modifying the surface of the insulating film 509, intensity of the insulating film 509 can be improved, and physical damage such as crack generation at the time of forming an opening or the like or film reduction at the time of etching can be reduced. Furthermore, by modifying the surface of the insulating film 509, interfacial quality such as adhesion with a light emitting layer 514 to be provided over the insulating film 509 is improved.

In addition, in the semiconductor device shown in FIGS. 15A and 15B, a light emitting layer 514 is formed over the first electrode 513, and a second electrode 515 is formed over the light emitting layer 514. A light emitting element 516 is provided with a laminated structure of the first electrode 513, the light emitting layer 514, and the second electrode 515.

One of the first electrode 513 and the second electrode 515 is used as an anode, and the other is used as a cathode.

A material having a high work function is preferably used for an anode. For example, a single-layer film such as an ITO film, an indium tin oxide film containing silicon, a transparent conductive film formed by a sputtering method using a target in which indium oxide is mixed with zinc oxide (ZnO) of 2 wt % to 20 wt %, a zinc oxide (ZnO) film, a titanium nitride film, a chromium film, a tungsten film, a Zn film, or a Pt film; a laminated layer of a film containing titanium nitride as its main component and a film containing aluminum as its main component; a three-layer structure of a titanium nitride film, a film containing aluminum as its main component, and another titanium nitride film; or the like. When a laminated structure is employed, an electrode can have low resistance as a wire and form a favorable ohmic contact. Further, the electrode can function as an anode.

A material having a low work function (Al, Ag, Li, Ca, or an alloy thereof such as MgAg, MgIn, AlLi, $CaF_2$, or calcium nitride) is preferably used for a cathode. In the case where an electrode used as a cathode is made to transmit light, a laminated layer of a metal thin film with a small thickness and a transparent conductive film (of ITO, indium tin oxide containing silicon, a transparent conductive film formed by a sputtering method using a target in which indium oxide is mixed with zinc oxide (ZnO) of 2 wt % to 20 wt %, zinc oxide (ZnO), or the like) is preferably used as the electrode.

Here, the first electrode 513 is formed using ITO which has a light transmitting property as an anode, and light is extracted from the substrate 501 side. Note that light may be extracted form the opposite substrate 506 side by using a material having a light transmitting property for the second electrode 515, or light can be extracted from both the substrate 501 side and the opposite substrate 506 side by forming the first electrode 513 and the second electrode 515 with a material having a light transmitting property (this structure is referred to as dual emission).

The light emitting layer 514 can be formed with a single layer or a laminated structure of a low molecular material, an intermediate molecular material (including an oligomer and a dendrimer), or a high molecular material (also referred to as a polymer) by various methods such as a vapor deposition method using an evaporation mask, an ink-jet method, and a spin coating method.

By attaching the substrate 501 to the opposite substrate 506 with the sealant 505, the light emitting element 516 according to the present invention is provided in a space 508 surrounded by the substrate 501, the opposite substrate 506, and the sealant 505. Note that there are cases where the space 508 is filled with the sealant 505 as well as an inert gas (nitrogen, argon, or the like).

Note that an epoxy-based resin is preferably used as the sealant 505. The material preferably allows as little moisture and oxygen as possible to penetrate. As a material of the opposite substrate 506, a plastic substrate formed of FRP (Fiberglass-Reinforced Plastics), PVF (polyvinyl fluoride), Myler, polyester, acrylic, or the like can be used besides a glass substrate or a quartz substrate. The opposite substrate 506 can be thinned similarly as described in the above embodiment mode. A protective film may be formed by performing surface treatment after thinning; here, an example of providing the insulating film 526 functioning as a protective film by performing surface treatment on the opposite substrate 506 is described. Alternatively, the insulating film 526 functioning as a protective film can be provided by performing the surface treatment described in the above embodiment mode after previously providing a plastic substrate.

Note that the semiconductor device including a pixel portion is not limited to the above-described structure using a light emitting element in a pixel portion, and it also includes a semiconductor device using liquid crystal in a pixel portion. The semiconductor device using liquid crystal in a pixel portion is shown in FIG. 16.

Figure 16:
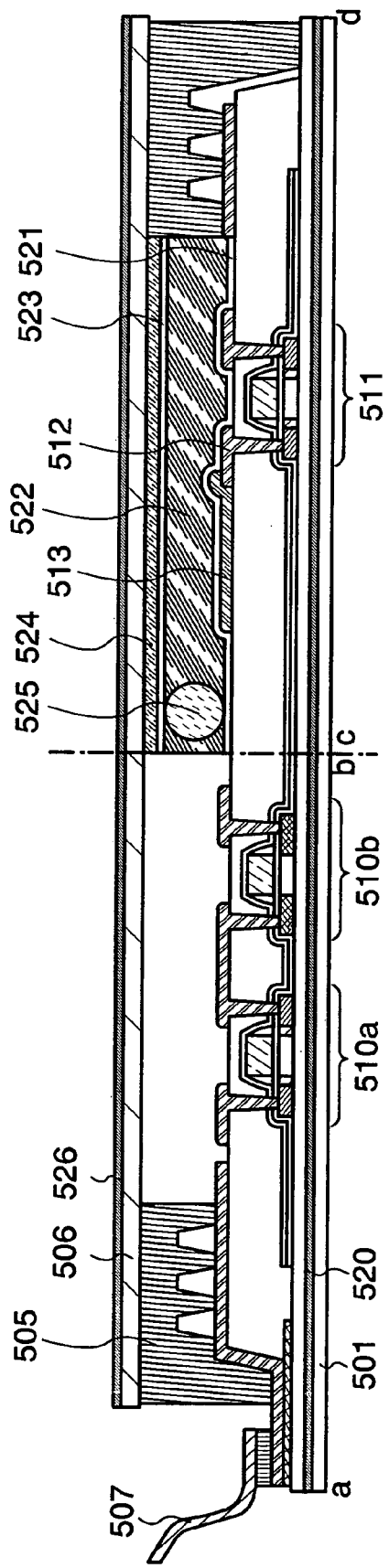
FIG. 16 is a diagram showing an example of a semiconductor device of the present invention.

FIG. 16 shows an example of a semiconductor device having liquid crystal in a pixel portion. Liquid crystal 522 is provided between an orientation film 521 provided to cover the conductive film 512 and the first electrode 513 and an orientation film 523 provided over the opposite substrate 506. In addition, a second electrode 524 is provided over the opposite substrate 506. An image is displayed by controlling light transmittance by controlling a voltage applied to liquid crystal provided between the first electrode 513 and the second electrode 524. Further, a spherical spacer 525 is provided in the liquid crystal 522 to control the distance (cell gap) between the first electrode 513 and the second electrode 524. Note that any of the structures described in this embodiment mode can be applied to the thin film transistors 510a, 510b, and 511.

As described above, in the semiconductor device described in this embodiment mode, the pixel portion may be provided with a light emitting element or liquid crystal.

Next, applications of a semiconductor device including the above pixel portion are explained with reference to drawings.

Application examples of a semiconductor device including the above pixel portion can be given as follows: a camera such as a video camera or a digital camera, a goggle type display (head mounted display), a navigation system, an audio reproducing device (car audio, an audio component, or the like), a computer, a game machine, a portable information terminal (a mobile computer, a cellular phone, a portable game machine, an electronic book, or the like), an image reproducing device including a recording medium reading portion (specifically, a device capable of processing data in a recording medium such as a digital versatile disc (DVD) and having a display which can display the image of the data), and the like. Practical examples of these electronic devices are described below.

Figure 17A:
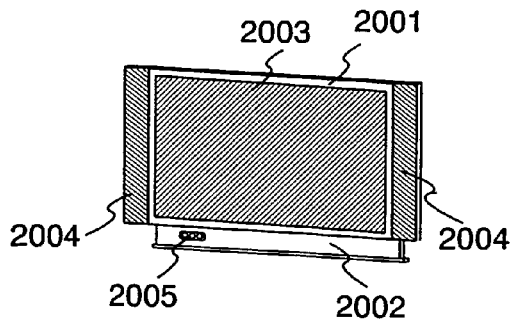
FIGS. 17A to 17G are diagrams showing examples of types of usage of a semiconductor device of the present invention.

FIG. 17A shows a TV receiver, which includes a chassis 2001, a support 2002, a display portion 2003, speaker portions 2004, a video input terminal 2005, or the like. The TV receiver can be manufactured by applying the structure described in Embodiment Mode 1 or 2 to a semiconductor device having a thin film transistor provided in the display portion 2003, a driver circuit, or the like.

Figure 17B:
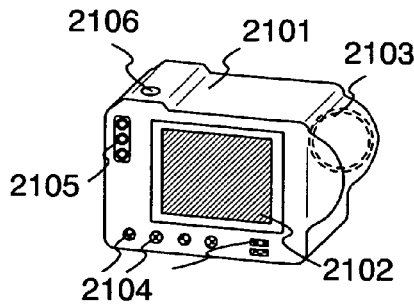

FIG. 17B shows a digital camera, which includes a main body 2101, a display portion 2102, an image receiving portion 2103, an operation key 2104, an external connection port 2105, a shutter 2106, or the like. The digital camera can be manufactured by applying the structure or manufacturing method described in the above embodiment mode to a semiconductor device having a thin film transistor provided in the display portion 2102, a driver circuit, or the like.

Figure 17C:
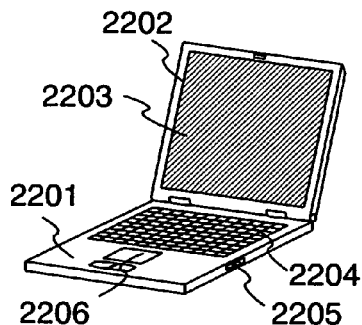

FIG. 17C shows a computer, which includes a main body 2201, a chassis 2202, a display portion 2203, a keyboard 2204, an external connection port 2205, a pointing mouse 2206, or the like. The computer can be manufactured by applying the structure or manufacturing method described in the above embodiment mode to a semiconductor device having a thin film transistor provided in the display portion 2203, a driver circuit, or the like.

Figure 17D:
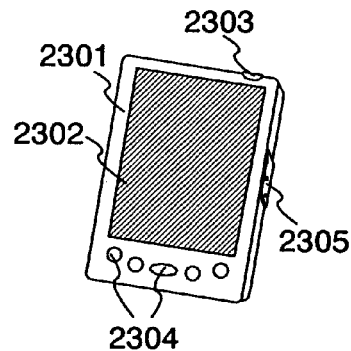

FIG. 17D shows a mobile computer, which includes a main body 2301, a display portion 2302, a switch 2303, an operation key 2304, an infrared port 2305, or the like. The mobile computer can be manufactured by applying the structure or manufacturing method described in the above embodiment mode to a semiconductor device having a thin film transistor provided in the display portion 2302, a driver circuit, or the like.

Figure 17E:
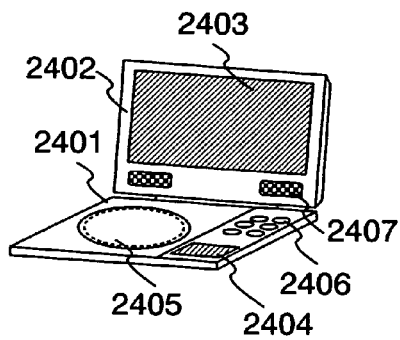

FIG. 17E shows a portable image reproducing device having a recording medium reading portion (a DVD reproducing device or the like), which includes a main body 2401, a chassis 2402, a display portion A 2403, a display portion B 2404, a recording medium (DVD or the like) reading portion 2405, an operation key 2406, a speaker portion 2407, or the like. The display portion A 2403 mainly displays image information, and the display portion B 2404 mainly displays textual information. The image reproducing device can be manufactured by applying the structure or manufacturing method described in the above embodiment mode to a semiconductor device having a thin film transistor provided in the display portion A 2403, the display portion B 2404, a driver circuit, or the like. Note that the image reproducing device having a recording medium reading portion includes a game machine and the like.

Figure 17F:
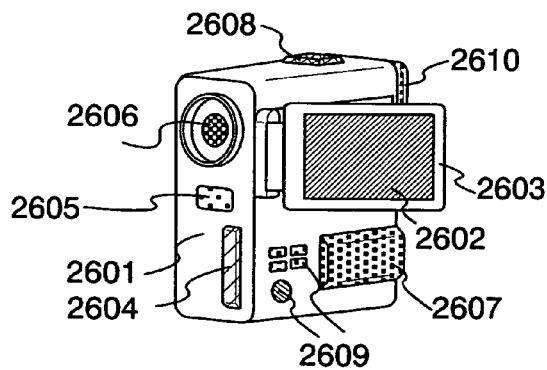

FIG. 17F shows a video camera, which includes a main body 2601, a display portion 2602, a chassis 2603, an external connection port 2604, a remote control receiving portion 2605, an image receiving portion 2606, a battery 2607, an audio input portion 2608, an operation key 2609, an eye piece portion 2610, or the like. The video camera can be manufactured by applying the structure or manufacturing method described in the above embodiment mode to a semiconductor device having a thin film transistor provided in the display portion 2602, a driver circuit, or the like.

Figure 17G:
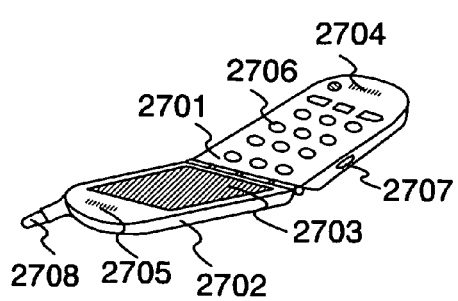

FIG. 17G shows a cellular phone, which includes a main body 2701, a chassis 2702, a display portion 2703, an audio input portion 2704, an audio output portion 2705, an operation key 2706, an external connection port 2707, an antenna 2708, or the like. The cellular phone can be manufactured by applying the structure or manufacturing method described in the above embodiment mode to a semiconductor device having a thin film transistor provided in the display portion 2703, a driver circuit, or the like.

The semiconductor device of the present invention can be made flexible by thinning a substrate. Hereinafter, a specific example of a flexible semiconductor device having a pixel portion is explained with reference to drawings.

Figure 18A:
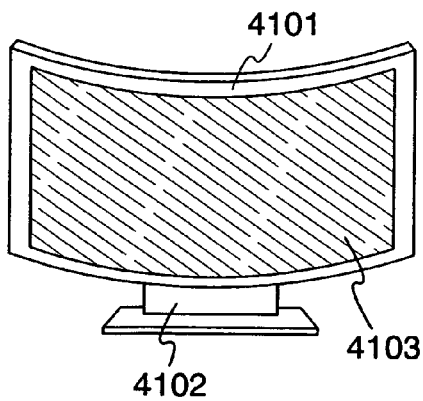
FIGS. 18A to 18F are diagrams showing examples of types of ussage of a semiconductor device of the present invention.

FIG. 18A shows a display, which includes a main body 4101, a support 4102, a display portion 4103, and the like. The display portion 4103 is formed using a flexible substrate, which can realize a lightweight and thin display. In addition, the display portion 4103 can be curved, and can be detached from the support 4102 and the display can be mounted along a curved wall. Thus, the flexible display can be provided over a curved portion as well as a flat surface; therefore, it can be used for various applications. A flexible display can be manufactured by using the flexible semiconductor device described in this embodiment mode or the above embodiment mode for the display portion 4103, a circuit, or the like.

Figure 18B:
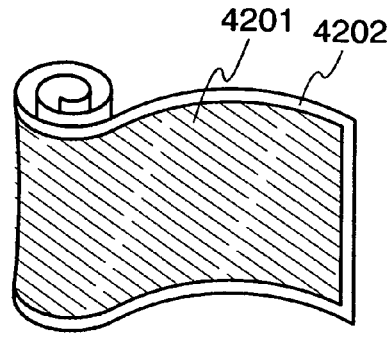

FIG. 18B shows a display that can be wound, which includes a main body 4201, a display portion 4202, and the like. Since the main body 4201 and the display portion 4202 are formed using a flexible substrate, the display can be carried in a bent or wound state. Therefore, even in the case where the display is large-size, the display can be carried in a bag in a bent or wound state. A flexible, lightweight, and thin large-sized display can be manufactured by using the flexible semiconductor device described in this embodiment mode or the above embodiment mode for the display portion 4202, a circuit, or the like.

Figure 18C:
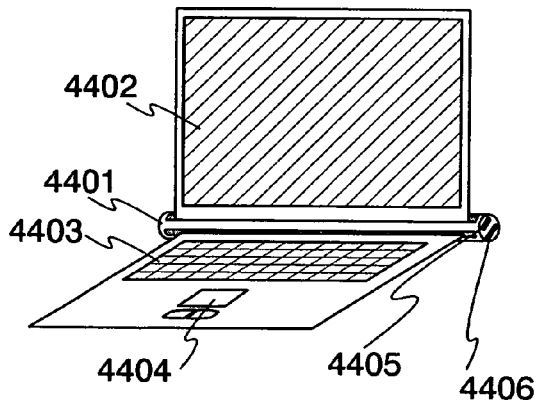

FIG. 18C shows a sheet-type computer, which includes a main body 4401, a display portion 4402, a keyboard 4403, a touch pad 4404, an external connection port 4405, a power plug 4406, and the like. The display portion 4402 is formed using a flexible substrate, which can realize a lightweight and thin computer. In addition, the display portion 4402 can be wound and stored in the main body if a portion of the main body 4401 is provided with a storage space. In addition, by also forming the key board 4403 to be flexible, the keyboard 4403 can be wound and stored in the storage space of the main body 4401 in a similar manner to the display portion 4402, which is convenient for carrying around. The computer can be stored without taking a place by bending when it is not used. A flexible, lightweight, and thin computer can be manufactured by using the flexible semiconductor device described in this embodiment mode or the above embodiment mode for the display portion 4402, a circuit, or the like.

Figure 18D:
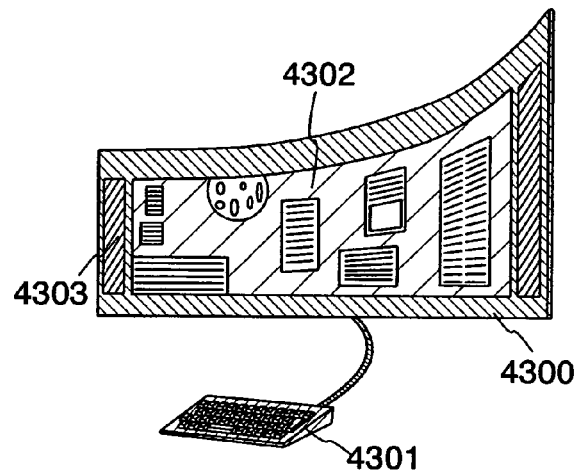

FIG. 18D shows a display device having a 20-inch to 80-inch large-sized display portion, which includes a main body 4300, a keyboard 4301 that is an operation portion, a display portion 4302, a speaker 4303, and the like. The display portion 4302 is formed using a flexible substrate, and the main body 4300 can be carried in a bent or wound state with the keyboard 4301 detached. In addition, the connection between the keyboard 4301 and the display portion 4302 can be performed without wires. For example, the main body 4300 can be mounted along a curved wall and can be operated with the key board 4301 without wires. In this case, a flexible, lightweight, and thin large-sized display device can be manufactured by using the flexible semiconductor device described in this embodiment mode or the above embodiment mode for the display portion 4302, a circuit, or the like.

Figure 18E:
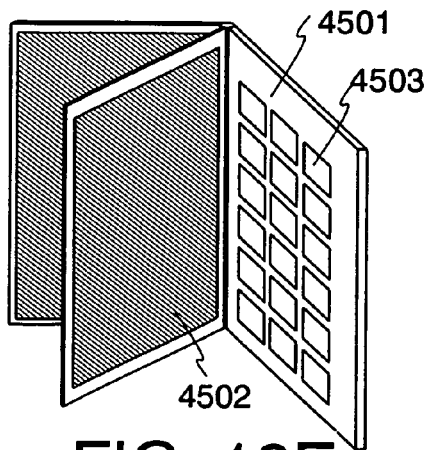

FIG. 18E shows an electronic book, which includes a main body 4501, a display portion 4502, an operation key 4503, and the like. In addition, a modem may be incorporated in the main body 4501. The display portion 4502 is formed using a flexible substrate and can be bent or wound. Therefore, the electronic book can also be carried without taking a place. Further, the display portion 4502 can display a moving image as well as a still image such as a character. A flexible, lightweight, and thin electronic book can be manufactured by using the flexible semiconductor device described in this embodiment mode or the above embodiment mode for the display portion 4502, a circuit, or the like.

Figure 18F:
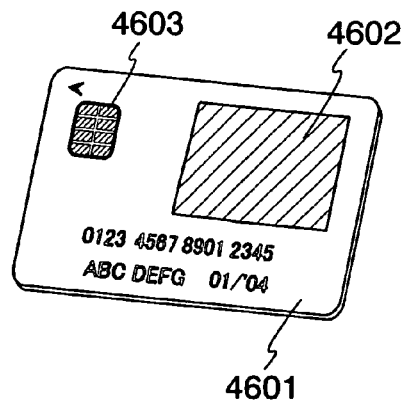

FIG. 18F shows an IC card, which includes a main body 4601, a display portion 4602, a connection terminal 4603, and the like. Since the display portion 4602 is formed to be a lightweight and thin sheet type using a flexible substrate, it can be formed over a card surface by attachment. When the IC card can receive data without contact, information obtained from outside can be displayed on the display portion 4602. A flexible, lightweight, and thin IC card can be manufactured by using the flexible semiconductor device described in this embodiment mode or the above embodiment mode for the display portion 4602, a circuit, or the like.

As described above, an applicable range of the semiconductor device of the invention is so wide that the semiconductor device of the invention can be applied to electronic devices of various fields. Note that this embodiment mode can be freely combined with the above embodiment mode.

This application is based on Japanese Patent Application serial no. 2005-192420 filed in Japan Patent Office on Jun. 30, 2005, the contents of which are hereby incorporated by reference.

What is claimed is:

1. A method for manufacturing a semiconductor device comprising the steps of:
    forming an insulating film over a glass substrate by performing plasma treatment on the glass substrate in a nitrogen atmosphere;
    forming an element group over the insulating film; and
    thinning the glass substrate after forming the element group.

2. The method for manufacturing the semiconductor device according to claim 1, wherein the glass substrate is thinned by performing either or both grinding treatment and polishing treatment.

3. The method for manufacturing the semiconductor device according to claim 1, wherein the nitrogen atmosphere is an atmosphere containing nitrogen and a noble gas, an atmosphere containing $NH_3$ and a noble gas, an atmosphere containing $NO_2$ and a noble gas, or an atmosphere containing $N_2O$ and a noble gas.

4. The method for manufacturing the semiconductor device according to claim 1, wherein the plasma treatment is performed using a high frequency wave under a condition that an electron density is in the range of $1\times10^{11}$ $cm^{-3}$ to $1\times10^{13}$ $cm^{-3}$ and an electron temperature is in the range of 0.5 eV to 1.5 eV.

5. The method for manufacturing the semiconductor device according to claim 4, wherein a microwave is used as the high frequency wave.

6. A method for manufacturing a semiconductor device comprising the steps of:
forming an insulating film over a glass substrate by performing plasma treatment on the glass substrate in a nitrogen atmosphere;
forming an element group over the insulating film;
thinning the glass substrate to form a thinned glass substrate; and
performing sealing with a flexible film so as to cover the thinned glass substrate and the element group.

7. The method for manufacturing the semiconductor device according to claim 6, wherein the glass substrate is thinned by performing either or both grinding treatment and polishing treatment.

8. The method for manufacturing the semiconductor device according to claim 6, wherein the nitrogen atmosphere is an atmosphere containing nitrogen and a noble gas, an atmosphere containing $NH_3$ and a noble gas, an atmosphere containing $NO_2$ and a noble gas, or an atmosphere containing $N_2O$ and a noble gas.

9. The method for manufacturing the semiconductor device according to claim 6, wherein the plasma treatment is performed using a high frequency wave under a condition that an electron density is in the range of $1\times10^{11}$ $cm^{-3}$ to $1\times10^{13}$ $cm^{-3}$ and an electron temperature is in the range of 0.5 eV to 1.5 eV.

10. The method for manufacturing the semiconductor device according to claim 9, wherein a microwave is used as the high frequency wave.

11. A method for manufacturing a semiconductor device comprising the steps of:
forming an insulating film over a substrate by performing plasma treatment on the substrate in a nitrogen atmosphere;
forming an element group over the insulating film;
thinning the substrate to form a thinned substrate; and
exposing the insulating film by performing chemical treatment to the thinned substrate to remove the thinned substrate.

12. The method for manufacturing the semiconductor device according to claim 11, wherein the substrate is thinned by performing either or both grinding treatment and polishing treatment.

13. The method for manufacturing the semiconductor device according to claim 11, wherein the nitrogen atmosphere is an atmosphere containing nitrogen and a noble gas, an atmosphere containing $NH_3$ and a noble gas, an atmosphere containing $NO_2$ and a noble gas, or an atmosphere containing $N_2O$ and a noble gas.

14. The method for manufacturing the semiconductor device according to claim 11, wherein the plasma treatment is performed using a high frequency wave under a condition that an electron density is in the range of $1\times10^{11}$ $cm^{-3}$ to $1\times10^{13}$ $cm^{-3}$ and an electron temperature is in the range of 0.5 eV to 1.5 eV.

15. The method for manufacturing the semiconductor device according to claim 14, wherein a microwave is used as the high frequency wave.

16. A method for manufacturing a semiconductor device comprising the steps of:
forming an insulating film over a substrate by performing plasma treatment on the substrate in a nitrogen atmosphere;
forming an element group over the insulating film;
thinning the substrate to form a thinned substrate;
exposing the insulating film by performing chemical treatment to the thinned substrate to remove the thinned substrate; and
performing sealing with a flexible film so as to cover the insulating film and the element group.

17. The method for manufacturing the semiconductor device according to claim 16, wherein the substrate is thinned by performing either or both grinding treatment and polishing treatment.

18. The method for manufacturing the semiconductor device according to claim 16, wherein the nitrogen atmosphere is an atmosphere containing nitrogen and a noble gas, an atmosphere containing $NH_3$ and a noble gas, an atmosphere containing $NO_2$ and a noble gas, or an atmosphere containing $N_2O$ and a noble gas.

19. The method for manufacturing the semiconductor device according to claim 16, wherein the plasma treatment is performed using a high frequency wave under a condition that an electron density is in the range of $1\times10^{11}$ $cm^{-3}$ to $1\times10^{13}$ $cm^{-3}$ and an electron temperature is in the range of 0.5 eV to 1.5 eV.

20. The method for manufacturing the semiconductor device according to claim 19, wherein a microwave is used as the high frequency wave.

21. A method for manufacturing a semiconductor device comprising the steps of:
forming an insulating film over a substrate by performing plasma treatment on the substrate in a nitrogen atmosphere;
forming an element group over the insulating film; and
exposing the insulating film by removing the substrate.

22. The method for manufacturing the semiconductor device according to claim 21, wherein the substrate is removed by performing at least chemical treatment.

23. The method for manufacturing the semiconductor device according to claim 21, wherein sealing is performed with a flexible film so as to cover the element group.

24. The method for manufacturing the semiconductor device according to claim 21, wherein the nitrogen atmosphere is an atmosphere containing nitrogen and a noble gas, an atmosphere containing $NH_3$ and a noble gas, an atmosphere containing $NO_2$ and a noble gas, or an atmosphere containing $N_2O$ and a noble gas.

25. The method for manufacturing the semiconductor device according to claim 21, wherein the plasma treatment is performed using a high frequency wave under a condition that an electron density is in the range of $1\times10^{11}$ $cm^{-3}$ to $1\times10^{13}$ $cm^{-3}$ and an electron temperature is in the range of 0.5 eV to 1.5 eV.

26. The method for manufacturing the semiconductor device according to claim 25, wherein a microwave is used as the high frequency wave.

* * * * *